(12) United States Patent
Katsube et al.

(10) Patent No.: US 8,538,364 B2
(45) Date of Patent: Sep. 17, 2013

(54) FILTER CIRCUIT AND RECEIVER USING THE SAME

(75) Inventors: Yusaku Katsube, Yokohama (JP);
Junichi Takahashi, Yokohama (JP);
Masaaki Yamada, Yokohama (JP);
Toshihito Habuka, Tamamura (JP);
Kenichi Shibata, Takasaki (JP);
Fumihito Yamaguchi, Maebashi (JP)

(73) Assignee: Renesas Electronics Corporation, Kanagawa (JP)

( * ) Notice: Subject to any disclaimer, the term of this patent is extended or adjusted under 35 U.S.C. 154(b) by 670 days.

(21) Appl. No.: 12/789,771

(22) Filed: May 28, 2010

(65) Prior Publication Data
US 2011/0026507 A1 Feb. 3, 2011

(30) Foreign Application Priority Data
Aug. 3, 2009 (JP) .................................. 2009-180415

(51) Int. Cl.
*H04B 1/10* (2006.01)
*H04K 3/00* (2006.01)

(52) U.S. Cl.
USPC ........................... 455/307; 455/339; 327/554

(58) Field of Classification Search
USPC ................ 455/306, 307, 338, 339; 327/552, 327/554, 559
See application file for complete search history.

(56) References Cited

U.S. PATENT DOCUMENTS 7,454,186 B2 * 11/2008 Yoneda et al. ................ 455/324
8,229,384 B2 * 7/2012 Yamada et al. ............... 455/266

FOREIGN PATENT DOCUMENTS

JP 2005-286810 A 10/2005
JP 2009-253814 A 10/2009

* cited by examiner

*Primary Examiner* — Lee Nguyen
(74) *Attorney, Agent, or Firm* — Mattingly & Malur, PC

(57) ABSTRACT

Gain setting can be performed at high speed while reducing DC offset due to a filter cutoff frequency changeover without the need for input signal muting. A filter circuit having first and second filters is capable of allowing settings of first and second cutoff frequencies. First and second filter switch circuits and a charging circuit including a charging resistor and a charging switch are provided. For a first time period, the first switch circuit is controllably turned on while the second switch circuit is controllably turned off, thereby providing the first filter function. For a second time period, the first switch circuit is controllably turned off while the second switch circuit is controllably turned on, thereby providing the second filter function. For the first time period, the charging switch is controllably turned on so that the second capacitor is charged via the charging resistor.

19 Claims, 10 Drawing Sheets

| Configuration | fc | Capacitor | Resistor | Parasitic capacitance | Passband gain |
|---|---|---|---|---|---|
| FIG. 4 | 1MHz | C1=10pF | R1=15.92kΩ | 1pF | - 0.8 dB |
|  | 10kHz | C2=10pF | R2=1592kΩ | 1pF | - 0.8 dB |
| FIG. 3 | 1MHz | C1=10pF | R=15.92kΩ | 1pF | - 0.8 dB |
|  | 10kHz | C2=990pF | R=15.92kΩ | 1pF | - 0.009dB |

FILTER CIRCUIT AND RECEIVER USING THE SAME

CLAIM OF PRIORITY

The present application claims priority from Japanese patent application JP 2009-180415 filed on Aug. 3, 2009, the content of which is hereby incorporated by reference into this application.

FIELD OF THE INVENTION

The present invention relates to a filter circuit and a receiver using the same, and more particularly to a technique that is effectively applicable to input signal attenuation by reducing DC offset due to a filter cutoff frequency changeover without the need for input signal muting.

BACKGROUND OF THE INVENTION

With regard to a receiver incorporated in a semiconductor integrated circuit for processing radio frequency (RF) signals in a mobile terminal for wireless communication or the like, it is commonly known to those skilled in the art that a superheterodyne scheme or a direct conversion scheme is used as a method for frequency conversion from the RF band to the baseband (low frequency band). In the superheterodyne scheme, received signals are frequency-converted through plural-step down-conversion processes; from the RF band to the intermediate frequency (IF) band, and then from the IF band to the baseband. Contrastingly, in the direct conversion scheme, received signals are frequency-converted through a single-step down-conversion process from the RF band directly to the baseband.

As compared with the superheterodyne scheme that uses the IF band, the direct conversion scheme is advantageous in that the physical size of a receiver can be reduced since IF-band-related circuit/filter components are not required. Hence, the direct conversion scheme is currently in widespread use for such a circuit as a radio frequency integrated circuit (RFIC) incorporated in a mobile terminal. The direct conversion scheme is, however, disadvantageous in that signal degradation is likely to occur due to flicker noise or DC component fluctuations (DC offset) caused by self-mixing. The term "flicker noise" as used herein signifies a kind of noise that appears in the vicinity of DC and increases in inverse proportion to frequency. The signal degradation due to DC offset is problematic particularly in the direct conversion scheme, though not limited thereto. Further, there may arise a problem regarding a settlement time period of a transient signal that occurs at the time of gain changeover in a baseband signal processing section used for processing baseband signals. For removing the DC offset, it is common practice to employ a highpass filter (HPF), which is designed for precluding a low frequency band. For preventing possible degradation of a desired signal appearing in a near-DC band, a cutoff frequency needs to be set up at a sufficiently low level in the highpass filter (HPF). In order to set up the cutoff frequency at a sufficiently low level, it is required to provide relatively large capacitance and resistance values in the design of the highpass filter (HPF). Since device elements having larger capacitance/resistance values are larger in physical size in general terms, the provision of the device elements having larger capacitance/resistance values will hinder reduction in physical size in the highpass filter (HPF) design. Further, in cases where device elements having larger capacitance/resistance values are included in the highpass filter (HPF), a time required for gain settlement is prolonged disadvantageously due to an increase in time constant of circuitry.

In Patent Document 1 indicated below, there is disclosed a technique wherein, for realizing high-speed operation in a direct-conversion transceiver, a cutoff frequency changeover is performed in a highpass filter (HPF) thereof while removing DC offset. More specifically, for a predetermined control time period to elapse from the start of RF signal reception, a higher cutoff frequency is set up by decreasing the time constant of the highpass filter (HPF) for shortening a settlement time. Thereafter, for a period corresponding to prevention of degradation of a desired signal, a lower cutoff frequency is set up by increasing the time constant thereof. Thus, it is intended to realize high-speed operation while removing DC offset.

Patent Document 1:

Japanese Unexamined Patent Publication No. 2005-286810

SUMMARY OF THE INVENTION

As cited above, the cutoff frequency changeover technique for a highpass filter (HPF) in a direct-conversion transceiver is described in the Patent Document 1.

Regarding the technique described in the Patent Document 1, the present inventors have conducted pre-examinations for the present invention. Through these pre-examinations, the present inventors have found the following problem: Since a period for signal muting is required at the time of a cutoff frequency changeover, signal reception is not allowed during this period. For example, in a wireless LAN system wherein high-speed gain setting is required during a short training sequence period, it may become impossible to properly receive short training sequence signals due to a period for signal muting required as mentioned above.

The present invention has been made through the pre-examinations conducted by the present inventors in the above technical background.

It is therefore an object of the present invention to provide a technique for enabling gain setting at high speed and reduction in DC offset due to a filter cutoff frequency changeover without the need for input signal muting.

The above and other objects, features and advantages of the present invention will become more apparent from the descriptions contained herein with reference to the accompanying drawings.

The representative aspects of the present invention are briefed below.

In carrying out the present invention and according to one aspect thereof, there is provided a filter circuit (7) capable of allowing settings of a first cutoff frequency and a second cutoff frequency, wherein the filter circuit (7) comprises: a first filter (C1X, R1X) including a first capacitor and a first resistor; a second filter (C2X, R2X) including a second capacitor and a second resistor; a first filter switch circuit (SW1X, SW4X) for coupling the first filter (C1X, R1X) on a signal path (Xin:Xout); a second filter switch circuit (SW3X, SW5X) for coupling the second filter (C2X, R2X) on the signal path (Xin:Xout); and a charging circuit (R3X:SW2X) coupled to the second filter (C2X, R2X). (Refer to FIG. 4.)

The charging circuit mentioned above is arranged to include at least a charging resistor (R3X) and a charging switch (SW2X) that are coupled in series with one end of the second capacitor (C2X) included in the second filter (C2X, R2X) and in series with the other end of the second capacitor (C2X) included therein, respectively.

For setting up the first cutoff frequency, the first filter switch circuit is controllably turned on while the second filter switch circuit is controllably turned off for a first time period (t001 to t002) so that the first filter (C1X, R1X) participates in operation of the filter circuit (7).

For setting up the second cutoff frequency, the first filter switch circuit is controllably turned off while the second filter switch circuit is controllably turned on for a second time period (t002 and thereafter) subsequent to the first time period (t001 to t002) so that the second filter (C2X, R2X) participates in operation of the filter circuit (7).

The charging switch (SW2X) included in the charging circuit is controllably turned on for the first period (t001 to t002) so that the second capacitor (C2X) included in the second filter can be charged via the charging resistor (R3X) included in the charging circuit.

Summarized below are advantageous effects to be provided according to the representative aspects of the present invention.

According to the present invention, it is possible to realize high-speed gain setting and reduction in DC offset due to a filter cutoff frequency changeover without the need for input signal muting.

DETAILED DESCRIPTION OF THE PREFERRED EMBODIMENTS

1. Summary of the Preferred Embodiments

Figure 1:
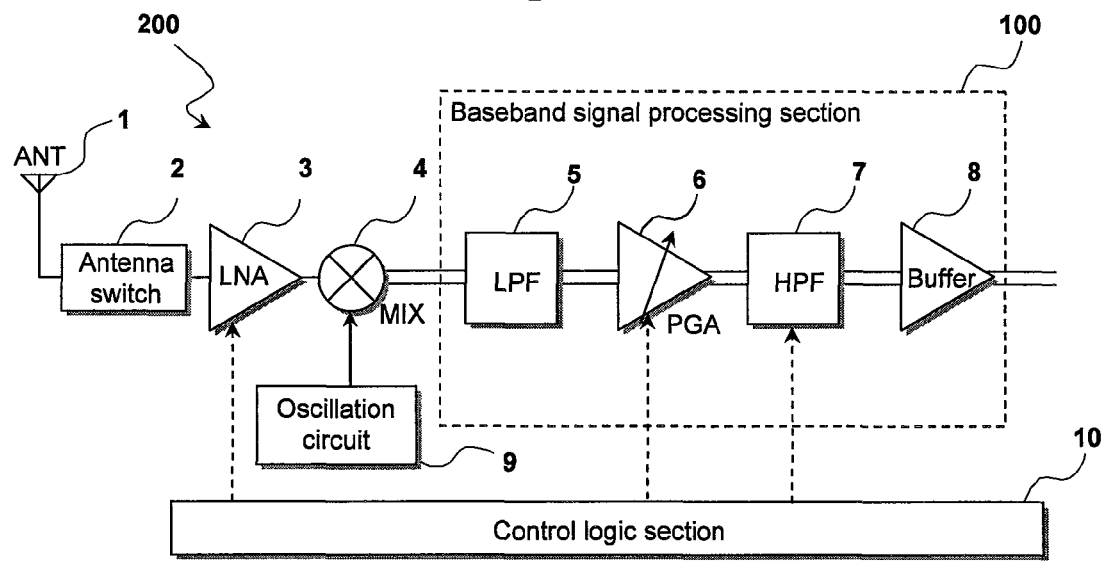
FIG. 1 is a schematic block diagram showing a configuration of a receiver according to a preferred embodiment 1 of the present invention.

First, the present invention will be described below regarding the overviews of representative preferred embodiments thereof. It is to be noted that, in the following description of the overviews of the representative preferred embodiments, parenthesized reference numerals are used for illustrative purposes only and designate respective parts that are included in the concepts of corresponding component elements identified by reference characters in the accompanying drawings.

[1] In accordance with a representative preferred embodiment of the present invention, a filter circuit (7) capable of allowing settings of a first cutoff frequency and a second cutoff frequency comprises: a first filter (C1X, R1X) including a first capacitor (C1X) and a first resistor (R1X); a second filter (C2X, R2X) including a second capacitor (C2X) and a second resistor (R2X); a first filter switch circuit (SW1X, SW4X) for coupling the first filter (C1X, R1X) on a signal path (Xin:Xout); a second filter switch circuit (SW3X, SW5X) for coupling the second filter (C2X, R2X) on the signal path (Xin:Xout); and a charging circuit (R3X:SW2X) coupled to the second filter (C2X, R2X). (Refer to FIG. 4.)

The charging circuit mentioned above is arranged to include at least a charging resistor (R3X) and a charging switch (SW2X) that are coupled in series with one end of the second capacitor (C2X) included in the second filter (C2X, R2X) and in series with the other end of the second capacitor (C2X) included therein, respectively.

For setting up the first cutoff frequency, the first filter switch circuit is controllably turned on while the second filter switch circuit is controllably turned off for a first time period (t001 to t002) so that the first filter (C1X, R1X) participates in operation of the filter circuit (7).

For setting up the second cutoff frequency, the first filter switch circuit is controllably turned off while the second filter switch circuit is controllably turned on for a second time period (t002 and thereafter) subsequent to the first time period (t001 to t002) so that the second filter (C2X, R2X) participates in operation of the filter circuit (7).

The charging switch (SW2X) included in the charging circuit is controllably turned on for the first time period (t001 to t002) so that the second capacitor (C2X) included in the second filter can be charged via the charging resistor (R3X) included in the charging circuit.

In the present representative embodiment mentioned above, since the second capacitor (C2X) included in the second filter is charged via the charging resistor (R3X) included in the charging circuit for the first time period (t001 to t002), an input is attenuated on the signal path (Xin:Xout). Hence, based on the first cutoff frequency, gain setting can be performed at high speed while reducing DC offset due to a filter cutoff frequency changeover without the need to mute an input signal.

According to a preferable aspect of the present representative embodiment, the first filter is arranged to provide a differential configuration including a first filter pair (C1X, R1X:C1Y, R1Y), the first capacitor is arranged to provide a differential configuration including a first capacitor pair (C1X:C1Y), and the first resistor is arranged to provide a differential configuration including a first resistor pair (R1X:R1Y).

The second filter is arranged to provide a differential configuration including a second filter pair (C2X, R2X:C2Y, R2Y), the second capacitor is arranged to provide a differential configuration including a second capacitor pair (C2X:C2Y), and the second resistor is arranged to provide a differential configuration including a second resistor pair (R2X:R2Y).

The first filter switch circuit is arranged to provide a differential configuration including a first filter switch circuit pair (SW1X, SW4X:SW1Y, SW4Y), and the second filter switch circuit is arranged to provide a differential configuration including a second filter switch circuit pair (SW3X, SW5X:SW3Y, SW5Y).

The charging circuit is arranged to provide a differential configuration including a charging circuit pair (R3X:SW2X; R3Y:SW2Y), the charging resistor is arranged to provide a differential configuration including a charging resistor pair (R3X, R3Y), and the charging switch is arranged to provide a differential configuration including a charging switch pair (SW2X, SW2Y). (Refer to FIG. 4.)

According to another preferable aspect of the present representative embodiment, each resistor of the charging resistor pair (R3X, R3Y) arranged in the differential configuration is coupled in parallel with each switch (SW3X:SW3Y) of the second filter switch circuit pair arranged in the differential configuration. (Refer to FIG. 4.)

Further, according to another preferable aspect of the present representative embodiment, each resistor of the second resistor pair (R2X:R2Y) arranged in the differential configuration is coupled in parallel with each switch (SW2X, SW2Y) of the charging switch pair arranged in the differential configuration, and a predetermined bias voltage (Vb) is applicable to a coupling point common to each resistor of the second resistor pair (R2X:R2Y) and each switch (SW2X, SW2Y) of the charging switch pair. (Refer to FIG. 4.)

Moreover, according to another preferable aspect of the present representative embodiment, the charging circuit further comprises a control switch pair (SW6X, SW6Y) arranged in a differential configuration.

One end of each switch of the control switch pair (SW6X, SW6Y) arranged in the differential configuration is coupled to one end of each capacitor of the second capacitor pair (C2X:C2Y) arranged in the differential configuration, and the other end of each switch of the control switch pair (SW6X, SW6Y) is coupled to one end of each resistor of the charging resistor pair (R3X, R3Y) arranged in the differential configuration. (Refer to FIG. 7.)

According to a specific aspect of the present representative embodiment, there is provided a short-circuit wiring line between mutually corresponding end nodes (p, q) of the respective resistors of the charging resistor pair (R3X, R3Y). (Refer to FIG. 7.)

According to another specific aspect of the present representative embodiment, a coupling switch (SW7) is disposed on a line between the mutually corresponding end nodes (p, q) of the respective resistors of the charging resistor pair (R3X, R3Y), and the coupling switch (SW7) is controllably turned on for the first time period. (Refer to FIG. 8.)

Further, according to another specific aspect of the present representative embodiment, the first filter pair (C1X, R1X:C1Y, R1Y) arranged in the differential configuration and the second filter pair (C2X, R2X:C2Y, R2Y) arranged in the differential configuration are incorporated in a semiconductor integrated circuit, and the first cutoff frequency is set up at a level higher than that of the second cutoff frequency.

[2] In accordance with another representative preferred embodiment of the present invention, a filter circuit (75) capable of allowing settings of a first cutoff frequency and a second cutoff frequency comprises: a first filter (C1X, R1X) including a first capacitor (C1X) and a first resistor (R1X); a second filter (C2X, R2X) including a second capacitor (C2X) and a second resistor (R2X); an operational amplifier (OP2) having an input terminal and an output terminal; a first filter switch circuit (SW1X, SW4X) for coupling the first filter (C1X, R1X) on a signal path (Xin:Xout) and to the input terminal and the output terminal of the operational amplifier (OP2); a second filter switch circuit (SW3X, SW5X) for coupling the second filter (C2X, R2X) on the signal path (Xin:Xout) and to the input terminal and the output terminal of the operational amplifier (OP2); and a charging circuit (R3X:SW2X) coupled to the second filter (C2X, R2X). (Refer to FIG. 12.)

The charging circuit mentioned above is arranged to include at least a charging resistor (R3X) and a charging switch (SW2X) that are coupled in series with one end of the second capacitor (C2X) included in the second filter (C2X, R2X) and in series with the other end of the second capacitor (C2X) included therein, respectively.

For setting up the first cutoff frequency, the first filter switch circuit is controllably turned on while the second filter switch circuit is controllably turned off for a first time period so that the first filter (C1X, R1X) participates in operation of the filter circuit (75).

For setting up the second cutoff frequency, the first filter switch circuit is controllably turned off while the second filter switch circuit is controllably turned on for a second time period subsequent to the first time period so that the second filter (C2X, R2X) participates in operation of the filter circuit (75).

The charging switch (SW2X) included in the charging circuit is controllably turned on for the first time period so that the second capacitor (C2X) included in the second filter can be charged via the charging resistor (R3X) included in the charging circuit.

In the present representative embodiment mentioned above, since the second capacitor (C2X) included in the second filter is charged via the charging resistor (R3X) included in the charging circuit for the first time period, an input is attenuated on the signal path (Xin:Xout). Hence, based on the first cutoff frequency, gain setting can be performed at high speed while reducing DC offset due to a filter cutoff frequency changeover without the need to mute an input signal.

According to a preferable aspect of the present representative embodiment, the first filter is arranged to provide a differential configuration including a first filter pair (C1X, R1X:C1Y, R1Y), the first capacitor is arranged to provide a differential configuration including a first capacitor pair (C1X:C1Y), and the first resistor is arranged to provide a differential configuration including a first resistor pair (R1X:R1Y).

The second filter is arranged to provide a differential configuration including a second filter pair (C2X, R2X:C2Y, R2Y), the second capacitor is arranged to provide a differential configuration including a second capacitor pair (C2X:C2Y), and the second resistor is arranged to provide a differential configuration including a second resistor pair (R2X:R2Y).

The first filter switch circuit is arranged to provide a differential configuration including a first filter switch circuit pair (SW1X, SW4X:SW1Y, SW4Y), and the second filter switch circuit is arranged to provide a differential configuration including a second filter switch circuit pair (SW3X, SW5X:SW3Y, SW5Y).

The charging circuit is arranged to provide a differential configuration including a charging circuit pair (R3X:SW2X; R3Y:SW2Y), the charging resistor is arranged to provide a differential configuration including a charging resistor pair (R3X, R3Y), and the charging switch is arranged to provide a differential configuration including a charging switch pair (SW2X, SW2Y). (Refer to FIG. 12.)

According to another preferable aspect of the present representative embodiment, each resistor of the charging resistor pair (R3X, R3Y) arranged in the differential configuration is coupled in parallel with each switch (SW3X:SW3Y) of the second filter switch circuit pair arranged in the differential configuration. (Refer to FIG. 12.)

Further, according to another preferable aspect of the present representative embodiment, each resistor of the second resistor pair (R2X:R2Y) arranged in the differential configuration is coupled to each switch (SW2X, SW2Y) of the charging switch pair arranged in the differential configuration, and a predetermined bias voltage (Vb) is applicable to a coupling point common to each switch (SW2X, SW2Y) of the charging switch pair. (Refer to FIG. 12.)

Moreover, according to another preferable aspect of the present representative embodiment, the charging circuit further comprises a control switch pair (SW6X, SW6Y) arranged in a differential configuration.

One end of each switch of the control switch pair (SW6X, SW6Y) arranged in the differential configuration is coupled to one end of each capacitor of the second capacitor pair (C2X:C2Y) arranged in the differential configuration, and the other end of each switch of the control switch pair (SW6X, SW6Y) is coupled to one end of each resistor of the charging resistor pair (R3X, R3Y) arranged in the differential configuration. (Refer to FIG. 13.)

According to a specific aspect of the present representative embodiment, there is provided a short-circuit wiring line between mutually corresponding end nodes (p, q) of the respective resistors of the charging resistor pair (R3X, R3Y). (Refer to FIG. 13.)

According to another specific aspect of the present representative embodiment, a coupling switch (SW7) is disposed on a line between the mutually corresponding end nodes (p, q) of the respective resistors of the charging resistor pair (R3X, R3Y), and the coupling switch (SW7) is controllably turned on for the first time period. (Refer to FIG. 14.)

Further, according to another specific aspect of the present representative embodiment, the first filter pair (C1X, R1X: C1Y, R1Y) arranged in the differential configuration and the second filter pair (C2X, R2X:C2Y, R2Y) arranged in the differential configuration are incorporated in a semiconductor integrated circuit, and the first cutoff frequency is set up at a level higher than that of the second cutoff frequency.

[3] In accordance with another representative preferred embodiment of the present invention, a receiver (200) comprises: a first amplifier (3) for amplifying a received signal; a mixer (4) for performing frequency conversion of an output signal from the first amplifier (3); and a baseband signal processing section (100) disposed at a stage posterior to the mixer (4) so as to process an output signal from the mixer (4).

The baseband signal processing section (100) includes a second amplifier (6) for amplifying a signal fed from the mixer (4), and a filter circuit (7, 74) for filtering an output signal from the second amplifier. (Refer to FIGS. 1, 9, 11, and 18.)

The filter circuit (7, 74) included in the baseband signal processing section (100) is implemented in a form of the filter circuit (7, 75) according to the representative preferred embodiment of the present invention described in either of the above subsections [1] and [2].

According to a preferable aspect of the present representative embodiment, the receiver (200) further comprises a control section (10).

The control section (10) is provided for setting up a gain level of the first amplifier (3) and a gain level of the second amplifier (6) in succession. Under direction of the control section (10), the first cutoff frequency is set up in the filter circuit (7, 74) for the first time period, and then the second cutoff frequency is set up in the filter circuit (7, 74) for the second time period. (Refer to FIG. 10.)

According to another preferable aspect of the present representative embodiment, the receiver (200) is arranged to be capable of receiving signals in conformance with the IEEE 802.11a, 802.11b, 802.11g, 802.11n, or 802.11p standard for wireless LAN communication.

For the first time period and the second time period, the receiver (200) can receive short training sequence signals for the wireless LAN communication. (Refer to FIG. 10.)

2. Further Detailed Description of the Preferred Embodiments

The following further describes the details of the preferred embodiments of the present invention. Throughout the accompanying drawings prepared for explaining the best modes for carrying out the present invention, like reference characters designate like or corresponding parts to avoid repetitive description thereof.

Preferred Embodiment 1

Receiver Configuration

Referring to FIG. 1, there is shown a configuration of a receiver 200 according to a preferred embodiment 1 of the present invention.

The receiver 200 illustrated in FIG. 1 is designed as a receiver circuit of a direct conversion type capable of directly converting RF signals to baseband signals through a single-step down-conversion process, though not particularly limited thereto. In a wireless LAN system wherein a period of time allowing gain setting or the like is provided, e.g., a short training sequence period is provided, the receiver 200 is applicable as a node for wireless LAN communication.

The receiver 200 includes an antenna 1 for signal transmission and reception, an antenna switch 2 for performing a changeover between transmission and reception, a low noise amplifier (LNA) 3, an oscillation circuit 9 for producing local signals required for frequency conversion, a mixer (MIX) 4 for performing frequency conversion, a lowpass filter (LPF) 5 for removing adjacent channel signals, a programmable gain amplifier (PGA) 6 for variable gain adjustment with digital control signals, a highpass filter (HPF) 7 for cutting off a low-frequency band that is likely to contain flicker noise or the like, a buffer 8, and a control logic section 10 for controlling each of these circuit blocks. A signal that has been frequency-converted through the receiver 200 is referred to as a baseband signal, and a circuit block that processes a baseband signal is referred to as a baseband signal processing section. In the configuration shown in FIG. 1, the lowpass filter (LPF) 5, the programmable gain amplifier (PGA) 6, the highpass filter (HPF) 7, and the buffer 8 are included in a baseband signal processing section 100.

An RF signal received by the antenna 1 is fed to a semiconductor integrated circuit for signal reception via the antenna switch 2, and then amplified by the low noise amplifier (LNA) 3. Thereafter, through the mixer (MIX) 4, the RF signal is mixed with a local frequency signal supplied from the oscillation circuit 9 for direct down-conversion to a baseband signal. The baseband signal obtained through down-conversion of the RF signal is fed to the lowpass filter (LPF) 5 for removal of adjacent channel signals, and then amplified to a desired amplitude level by the programmable gain amplifier (PGA) 6. The highpass filter (HPF) 7 is provided for removing DC offset and flicker noise. At the final stage of the baseband signal processing section 100, the buffer 8 is disposed for outputting the baseband signal without distortion even in a low-impedance load condition. It is to be noted that, under direction of the control logic section 10, it is allowed to change a cutoff frequency of the highpass filter (HPF) 7 and also to adjust a gain level of the low noise amplifier (LNA) 3 and a gain level of the programmable gain amplifier (PGA) 6.

In an ordinary wireless LAN system, a baseband signal containing an in-phase component (I signal component) and a quadrature component (Q signal component) is used for quadrature demodulation, and there are provided respective circuits for processing I and Q signal components. Since these circuits for processing I and Q signal components are configured in a similar arrangement, only the baseband signal processing section 100 for processing I signal components is described here for the sake of simplicity in explanation of the preferred embodiment 1 of the present invention, without duplicative description of a baseband signal processing section for processing Q signal components.

Described below are the details of the highpass filter (HPF) 7.

<Highpass Filter>

Figure 4:
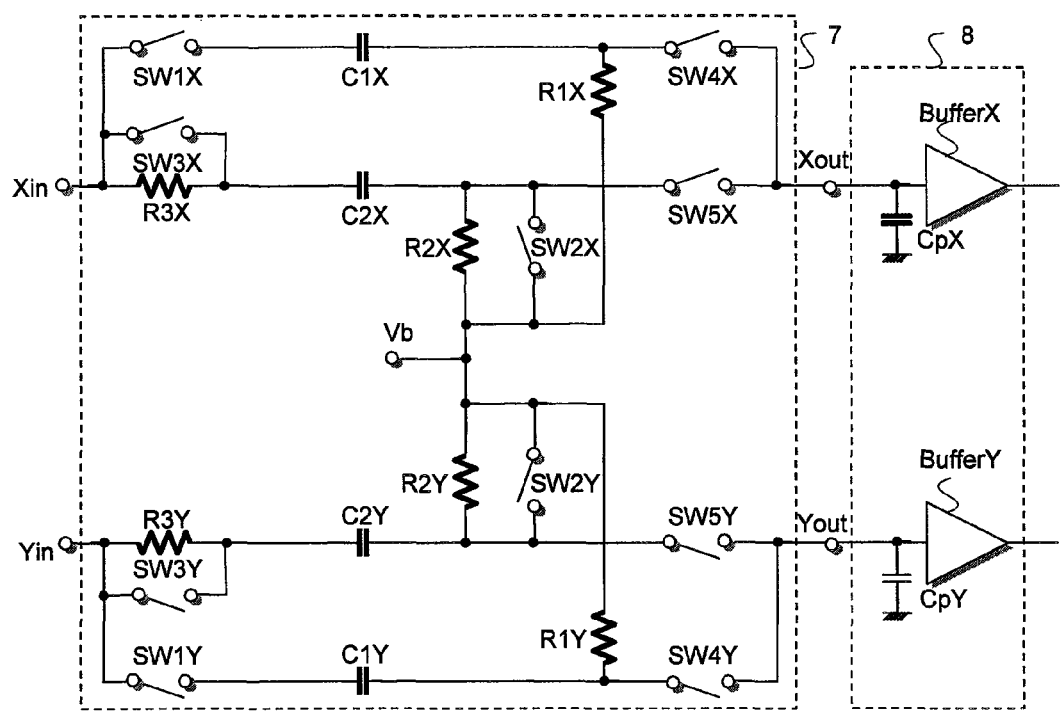
FIG. 4 is a circuit diagram showing a configuration of the highpass filter (HPF) 7 included in the receiver 200 illustrated in FIG. 1 according to the preferred embodiment 1 of the present invention.

Referring to FIG. 4, there is shown a configuration of the highpass filter (HPF) 7 included in the receiver 200 illustrated in FIG. 1 according to the preferred embodiment 1 of the present invention.

The highpass filter (HPF) 7 shown in FIG. 4 includes the following components; differential input terminals Xin and Yin, resistors R1X and R1Y, resistors R2X and R2Y, input resistors R3X and R3Y, input capacitors C1X and C1Y, input capacitors C2X and C2Y, switches SW1X, SW1Y, SW2X, SW2Y, SW3X, SW3Y, SW4X, SW4Y, SW5X and SW5Y, and differential output terminals Xout and Yout.

In the first filter including the input capacitor C1X/C1Y and the resistor R1X/R1Y, a cutoff frequency thereof is set up at a level higher (e.g., approximately 100 times higher) than that in the second filter including the input capacitor C2X/C2Y and the resistor R2X/R2Y.

For setting up a higher cutoff frequency in the highpass filter (HPF) 7 shown in FIG. 4, the resistor R1X/R1Y and the input capacitor C1X/C1Y included in the first filter are selected to participate in circuit operation of the highpass filter (HPF) 7. Contrastingly, for setting up a lower cutoff frequency in the highpass filter (HPF) 7 shown in FIG. 4, the resistor R2X/R2Y and the input capacitor C2X/C2Y are selected to participate in circuit operation of the highpass filter (HPF) 7.

In the highpass filter (HPF) 7, the input switch SW1X/SW1Y is coupled between the differential input terminal Xin/Yin and the input capacitor C1X/C1Y of the first filter, and a parallel-coupling circuit formed of the input switch SW3X/SW3Y and the input resistor R3X/R3Y is disposed between the differential input terminal Xin/Yin and the input capacitor C2X/C2Y of the second filter.

One end of the resistor R1X/R1Y of the first filter is coupled to the differential input terminal Xin/Yin via the input capacitor C1X/C1Y and the input switch SW1X/SW1Y. Further, the one end of the resistor R1X/R1Y of the first filter is also coupled to the output terminal Xout/Yout of the highpass filter (HPF) 7 via the output switch SW4X/SW4Y, and the other end of the resistor R1X/R1Y of the first filter is coupled to the bias voltage Vb.

One end of the resistor R2X/R2Y of the second filter is coupled to the differential input terminal Xin/Yin via the input capacitor C2X/C2Y and the parallel-coupling circuit formed of the input switch SW3X/SW3Y and the input resistor R3X/R3Y. Further, the one end of the resistor R2X/R2Y of the second filter is also coupled to the output terminal Xout/Yout of the highpass filter (HPF) 7 via the output switch SW5X/SW5Y. The other end of the resistor R2X/R2Y of the second filter is coupled to the bias voltage Vb. Furthermore, the resistor R2X/R2Y of the second filter is coupled in parallel with the parallel switch SW2X/SW2Y.

Mutually opposite operations are performed between the input switch SW1X/SW1Y and the input switch SW3X/SW3Y, between the output switch SW4X/SW4Y and the output switch SW5X/SW5Y, and between the parallel switch SW2X/SW2Y and the input switch SW3X/SW3Y.

More specifically, for setting up the higher cutoff frequency in the first filter of the highpass filter (HPF) 7 shown in FIG. 4, the input switch SW1X/SW1Y, the parallel switch SW2X/SW2Y, and the output switch SW4X/SW4Y are controllably turned on while the input switch SW3X/SW3Y and the output switch SW5X/SW5Y are controllably turned off. In this state, the input capacitor C2X/C2Y of the second filter is charged via the input resistor R3X/R3Y at a bias level of a differential input signal fed from the differential input terminal Xin/Yin.

Contrastingly, for setting up the lower cutoff frequency in the second filter of the highpass filter (HPF) 7 shown in FIG. 4, the input switch SW1X/SW1Y, the parallel switch SW2X/SW2Y, and the output switch SW4X/SW4Y are controllably turned off while the input switch SW3X/SW3Y and the output switch SW5X/SW5Y are controllably turned on.

<Short Training Sequence Period>

The following describes an exemplary signal receiving operation in conformance with the wireless LAN standard IEEE 802.11a for packet communication wherein a short training sequence period is provided.

Figure 19:
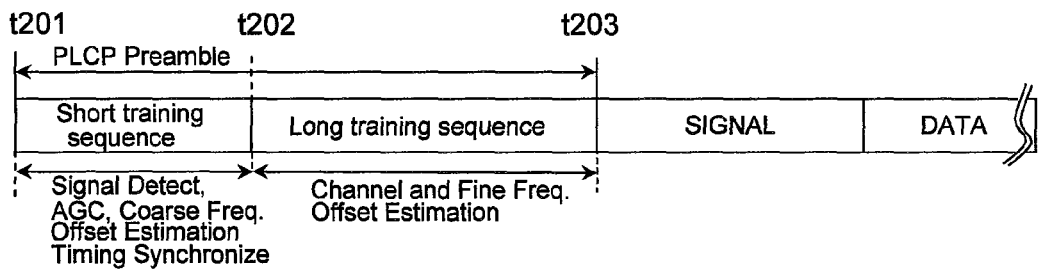
FIG. 19 is an explanatory diagram showing a packet structure in Orthogonal Frequency Division Multiplexing (OFDM) in conformance with the wireless LAN standard IEEE 802.11a that is an example illustrative of a wireless LAN communication scheme for signaling to the receiver 200 illustrated in FIG. 1.

Referring to FIG. 19, there is shown an explanatory diagram of a packet structure in Orthogonal Frequency Division Multiplexing (OFDM) in conformance with the wireless LAN standard IEEE 802.11a that is an example illustrative of a wireless LAN communication scheme for signaling to the receiver 200 illustrated in FIG. 1.

In accordance with the Physical Layer Convergence Procedure (PLOP) for OFDM specified in the wireless LAN standard IEEE 802.11a, a PLOP preamble from time point t201 to time point t203 is formed of a short training sequence corresponding to a period from time point t201 to time point t202, and a long training sequence corresponding to a period from time point t202 to time point t203 as shown in FIG. 19. In common applications, the short training sequence is used for signal detection, automatic gain control, coarse frequency offset estimation, and timing synchronization; and the long training sequence is used for channel estimation and fine frequency tuning.

<Changeover Operation of Cutoff Frequency>

Figure 6:
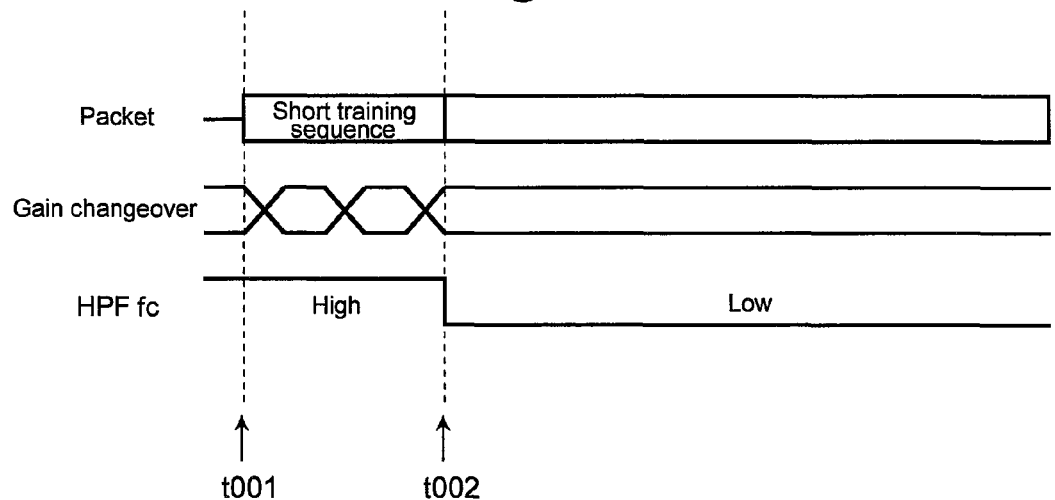
FIG. 6 is a timing chart showing a cutoff frequency changeover operation in the highpass filter (HPF) 7 of FIG. 4 that is included in the receiver 200 according to the preferred embodiment 1 of the present invention.

Referring to FIG. 6, there is shown a timing chart of a cutoff frequency changeover operation in the highpass filter (HPF) 7 of FIG. 4 that is included in the receiver 200 according to the preferred embodiment 1 of the present invention.

During the short training sequence period from time point t001 to time point t002, a gain setting operation is carried out as shown in FIG. 6. At time point t001, the gain setting operation is started. For shortening a time required for gain settlement in the highpass filter (HPF) 7 shown in FIG. 4, prior to time point t001, the input switch SW1X/SW1Y, the parallel switch SW2X/SW2Y, and the output switch SW4X/SW4Y are controllably turned on while the input switch SW3X/SW3Y and the output switch SW5X/SW5Y are controllably turned off. In this state, the higher cutoff frequency is set up since the highpass filter (HPF) 7 is component-wise operative with the input capacitor C1X/C1Y and the resistor R1X/R1Y of the first filter. In the case of setting up the higher frequency, the bias level of the differential input signal fed from the differential input terminal Xin/Yin via the input resistor R3X/R3Y and the bias voltage Vb are applied across the input capacitor C2X/C2Y of the second filter. Thus, the input capacitor C2X/C2Y of the second filter is quick-charged. At the time of this quick-charging, since the input capacitor C2X/C2Y is charged via the input resistor R3X/R3Y, a lowpass filter (LPF) function is provided. Hence, a certain time constant is involved in the charging of the input capacitor C2X/C2Y so as to absorb DC offset appearing at the differential input terminal Xin/Yin.

Then, upon completion of the gain setting operation at time point t002, a cutoff frequency changeover operation is performed. For a changeover to the lower cutoff frequency, the input switch SW1X/SW1Y, the parallel switch SW2X/SW2Y, and the output switch SW4X/SW4Y are controllably turned off while the input switch SW3X/SW3Y and the output switch SW5X/SW5Y are controllably turned on. In this state, the lower cutoff frequency is set up since the highpass filter (HPF) 7 is component-wise operative with the input capacitor C2X/C2Y and the resistor R2X/R2Y of the second filter. Thus, after time point t002, the lower cutoff frequency is set up in the highpass filter (HPF) 7 shown in FIG. 4, thereby removing flicker nose and DC offset while preventing degradation of a desired signal in the vicinity of DC. Hence, the use of the configuration of the highpass filter (HPF) 7 shown in FIG. 4 makes it possible to realize high-speed gain changeover and DC offset removal even in a wireless communication system having a requirement for a relatively short gain setting period such as a wireless LAN system. The receiver 200 capable of absorbing DC offset due to a cutoff frequency changeover can thus be provided as a desirable receiving circuit for wireless communication.

<Highpass Filters Pre-Examined as Comparative Examples>

Figure 2:
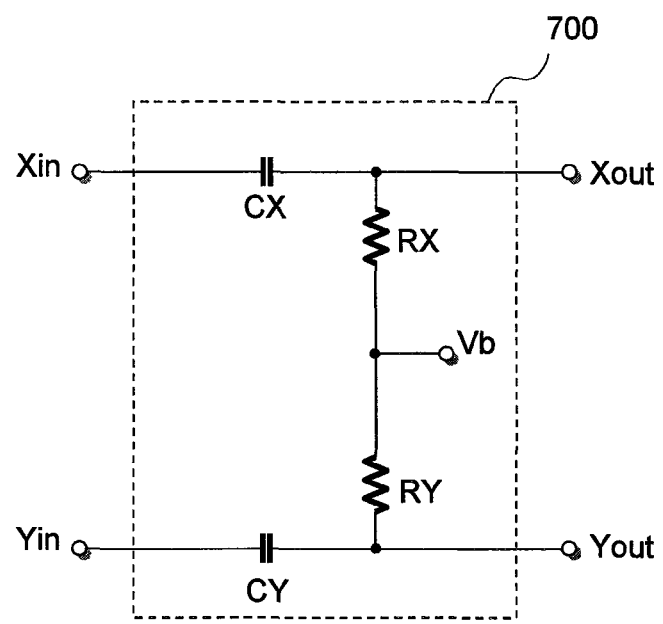
FIG. 2 is a circuit diagram showing a configuration of a highpass filter (HPF) 700 that has been pre-examined for the present invention by the present inventors as a comparative example with respect to a highpass filter (HPF) 7 illustrated in FIG. 4.

Referring to FIG. 2, there is shown a configuration of a highpass filter (HPF) 700 that has been pre-examined for the present invention by the present inventors as a comparative example with respect to the highpass filter (HPF) 7 illustrated in FIG. 4.

The highpass filter (HPF) 700 shown in FIG. 2 comprises capacitors CX and CY and resistors RX and RY. In the highpass filter (HPF) 700, a cutoff frequency thereof is set up fixedly.

Figure 3:
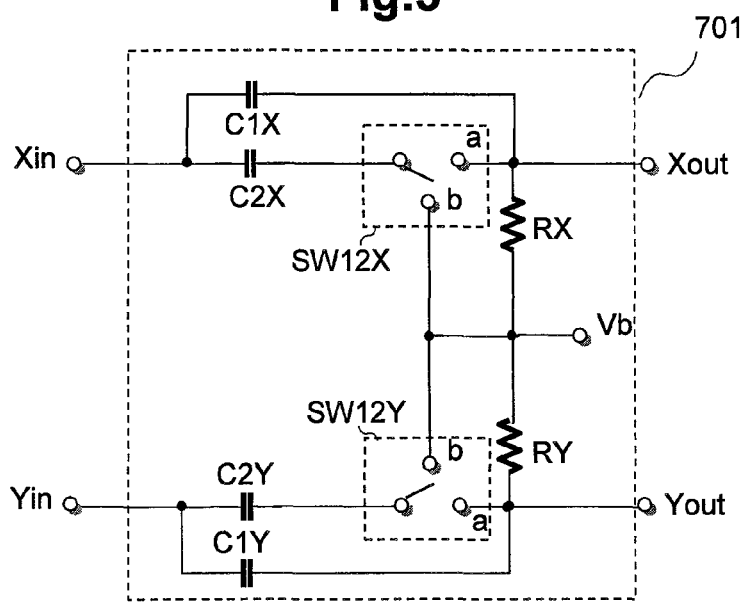
FIG. 3 is a circuit diagram showing a configuration of a highpass filter (HPF) 701 that has been pre-examined for the present invention by the present inventors as another comparative example with respect to the highpass filter (HPF) 7 illustrated in FIG. 4.

Referring to FIG. 3, there is shown a configuration of a highpass filter (HPF) 701 that has been pre-examined for the present invention by the present inventors as another comparative example with respect to the highpass filter (HPF) 7 illustrated in FIG. 4.

The highpass filter (HPF) 701 shown in FIG. 3 comprises capacitors C1X and C2X, switches SW12X and SW12Y, resistors RX and RY, and capacitors C1Y and C2Y.

In the highpass filter (HPF) 701, when a contact "b" is selected by the switch SW12X/SW12Y, a first filter is formed of the capacitor C1X/C2Y and the resistor RX/RY while the input capacitor C2X/C2Y unused for filtering operation is charged at a bias level of a differential input signal fed from a differential input terminal Xin/Yin. When a contact "a" is selected by the switch SW12X/SW12Y, the capacitor C1X and the capacitor C2X are coupled in parallel, and the capacitor C1Y and the capacitor C2Y are also coupled in parallel, thereby forming a second filter pair. Thus, a lower cutoff frequency is set up in the highpass filter (HPF) 701.

Then, the following discusses the cases of application where each of the highpass filter (HPF) 700 shown in FIG. 2 and the highpass filter (HPF) 701 is used in lieu of the highpass filter (HPF) 7 of FIG. 4 in the receiver 200 illustrated in FIG. 1 according to the preferred embodiment 1 of the present invention.

<Highpass Filter Output Waveforms in Respective Schemes>

Referring to FIGS. 5(A) to 5(E), there are shown graphic diagrams of output waveforms of highpass filters of respective schemes on occurrence of DC offset due to a gain changeover in the programmable gain amplifier (PGA) 6 in the cases of application where each of the highpass filters of the respective schemes is used in lieu of the highpass filter (HPF) 7 of FIG. 4 in the receiver 200 illustrated in FIG. 1 according to the preferred embodiment 1 of the present invention, along with the case where the highpass filter 7 of FIG. 4 is used in the receiver 200. In each of FIGS. 5(A) to 5(E), the vertical axis represents the level of output, and the horizontal axis represents the lapse of time.

Figure 5:
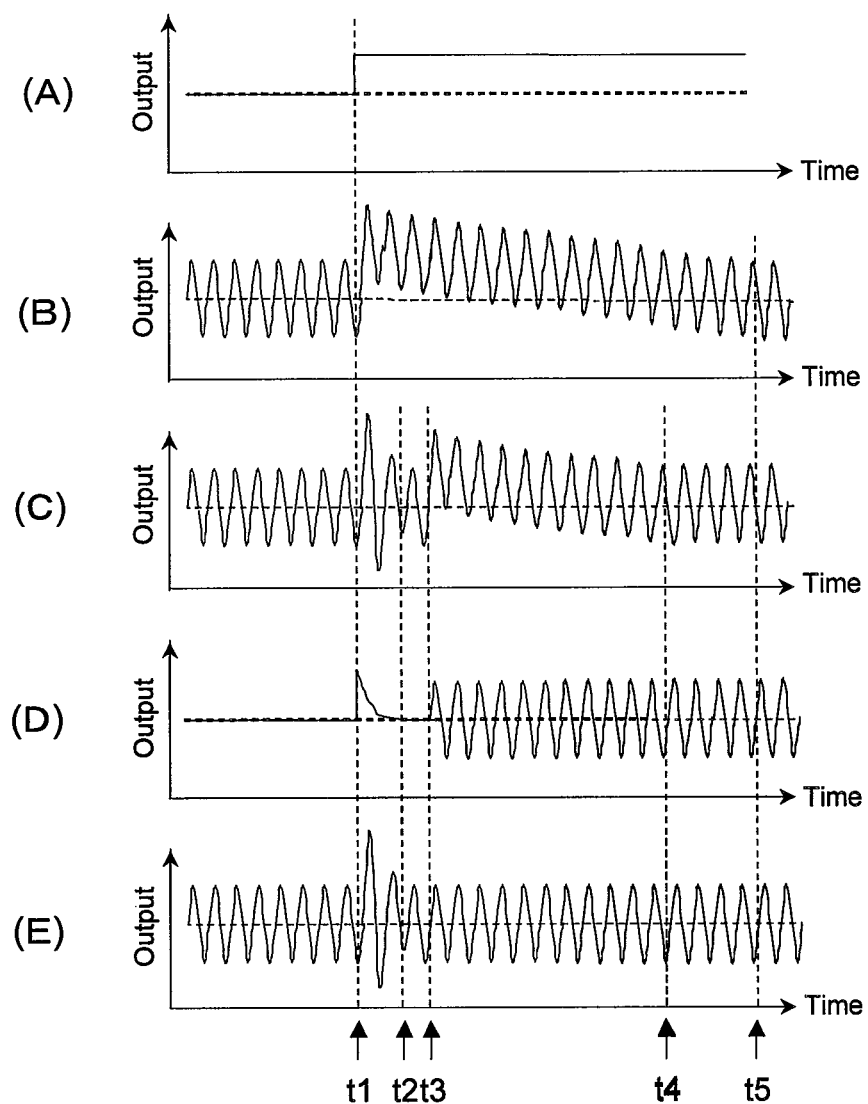
FIGS. 5(A) to 5(E) are graphic diagrams showing output waveforms of highpass filters of respective schemes on occurrence of DC offset due to a gain changeover in a programmable gain amplifier (PGA) 6 in the cases of application where each of the highpass filters of the respective schemes is used in lieu of the highpass filter (HPF) 7 in the receiver 200 illustrated in FIG. 1 according to the preferred embodiment 1 of the present invention.

FIG. 5(A) shows an output waveform under a condition where, for gain setting during the short training sequence period shown in FIG. 6, a gain changeover operation is performed at time point t1 in the programmable gain amplifier (PGA) 6 of the receiver 200, resulting in the occurrence of DC offset at output from the programmable gain amplifier (PGA) 6.

FIG. 5(B) shows an output waveform under a condition where the highpass filter (HPF) 700 shown in FIG. 2 is used. In the highpass filter (HPF) 700 not capable of performing a cutoff frequency changeover operation, a relatively large time constant is predetermined by the resistors RX and RY and the capacitors CX and CY so that a cutoff frequency thereof is set up in the vicinity of DC, with the intention of preventing degradation of a desired signal. Hence, due to the relatively large time constant in the highpass filter (HPF) 700, a relatively long period extending to time point t5 is required for allowing the convergence of DC offset appearing at time point t1 corresponding to the instant of a gain changeover. Consequently, it is inevitable to incur signal degradation in the highpass filter (HPF) 700.

FIG. 5(C) shows an output waveform under a condition where the highpass filter (HPF) 701 shown in FIG. 3 is used. In the highpass filter (HPF) 701 capable of performing a cutoff frequency changeover operation, until time point t3, the contact "b" is selected by the switch SW12X/SW12Y to set up a higher cutoff frequency while the capacitor C2X/C2Y is charged with the bias voltage Vb. After time point t3, the contact "a" is selected by the switch SW12X/SW12Y to set up a lower cutoff frequency. Since the higher cutoff frequency is set up in the highpass filter (HPF) 701 shown in FIG. 3 until time point t3, the convergence of DC offset appearing at time point t1 due to a gain changeover may be effected for a relatively short period until time point t2. However, if an excessive input amplitude voltage is present at the differential input terminal Xin/Yin of the highpass filter (HPF) 701 shown in FIG. 3 at time point t3 corresponding the instant of a cutoff frequency changeover, the capacitor C2X/C2Y is charged with the excessive input amplitude voltage and DC offset voltage. Thus, DC offset occurs due to the excessive input amplitude at time point t3. Hence, after time point t3, since the lower cutoff frequency is set up in the highpass filter (HPF) 701 shown in FIG. 3, a relatively long period until time point t4 is required for allowing the convergence of DC offset due to the excessive input amplitude voltage. This results in signal degradation in the highpass filter (HPF) 701. For preventing the signal degradation in the above case, it is required to perform input signal muting until time point t3 as proposed in the Patent Document 1 cited in the foregoing description.

FIG. 5(D) shows an output waveform under a condition where a scheme for input signal muting is adopted. In the input signal muting scheme wherein a cutoff frequency changeover operation is performed, the highpass filter (HPF) 701 shown in FIG. 3 is used as a highpass filter in which an input signal muted. Until time point t3, the input signal to the highpass filter (HPF) 701 is muted, and after time point t3, the input signal is processed without muting. Since the higher cutoff frequency is set up in the highpass filter (HPF) 701 shown in FIG. 3 until time point t3, the convergence of DC offset appearing at time point t1 due to a gain changeover may be effected for a relatively short period until time point t2. At time point t3 corresponding to a cutoff frequency changeover, the input signal fed to the differential input terminal Xin/Yin of the highpass filter (HPF) 701 shown in FIG. 3 is still muted, and hence no excessive input amplitude voltage is involved. The capacitor C2X/C2Y is charged with the DC offset voltage only. Thus, even in a situation where a cutoff frequency changeover operation is performed at time point t3, it is allowed to obtain an output with DC offset reduced.

However, the following has become apparent through pre-examinations conducted by the present inventors: In the input signal muting scheme described with reference to FIG. 5(D), input signal muting is needed until time point t3. Hence, in cases where it is required to perform gain setting at high speed during the short training sequence period in conformance with the wireless LAN standard IEEE 802.11a shown in FIG. 19, there arises a disadvantage that short training sequence signals cannot be received properly.

FIG. 5(E) shows an output waveform under a condition where the highpass filter (HPF) 7 shown in FIG. 4 is used. In the highpass filter (HPF) 7, the higher cutoff frequency is set up until time point t3, and after time point t3, the lower cutoff frequency is set up. With the higher cutoff frequency set up in the highpass filter (HPF) 7 shown in FIG. 4 until time point t3, the convergence of DC offset appearing at time point t1 due to a gain changeover may be effected for a relatively short period until time point t2. Further, for a period until time point t3, the input capacitor C2X/C2Y of the second filter to be used after a cutoff frequency changeover is charged via the input resistor R3X/R3Y at an input amplitude applied to the differential input terminal Xin/Yin in a form of a lowpass filter (LPF) function. Thus, the input amplitude can be attenuated without having to perform input signal muting. That is to say, in the lowpass filter (LPF) function form, the input amplitude applied to the differential input terminal Xin/Yin is attenuated, and the input capacitor C2X/C2Y is charged with the DC offset voltage. Hence, even in a situation where a cutoff frequency changeover operation is performed at time point t3, there occurs no variation in DC offset. Through the use of the highpass filter (HPF) 7 of FIG. 4 in the receiver 200 shown in FIG. 1 according to the preferred embodiment 1 of the present invention, it is possible to provide gain settlement at high speed and reduction in DC offset during the short training sequence period specified in the wireless LAN standard IEEE 802.11a without the need for input signal muting as described above with reference to FIG. 5(D).

In the receiver 200 shown in FIG. 1 according to the preferred embodiment 1 of the present invention, the highpass filter (HPF) 7 is disposed at a stage posterior to the programmable gain amplifier (PGA) 6. It is to be noted, however, that the present invention is not particularly limited to the arrangement mentioned above. In cases where DC offset does not occur in the programmable gain amplifier (PGA) 6, there may also be provided such an arrangement that the highpass filter (HPF) 7 is disposed a stage anterior to the programmable gain amplifier (PGA) 6, for example.

In the timing sequence shown in FIG. 6 to be taken in the highpass filter (HPF) 7 shown in FIG. 4 according the preferred embodiment 1 of the present invention, a cutoff frequency changeover operation is performed after completion of gain setting made at time point t002. It is to be noted, however, that the present invention is not particularly limited to the timing mentioned above.

<Another Changeover Operation of Cutoff Frequency>

Figures 16, 17:
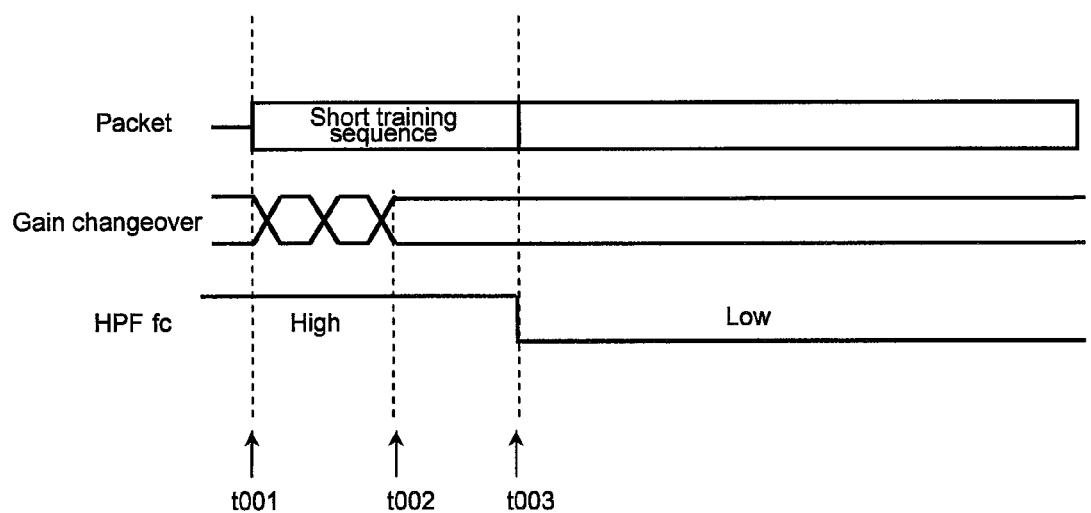
FIG. 16 is a tabular diagram showing the results of comparison of filter element constants and characteristics between the highpass filter (HPF) 701 of FIG. 3 that has been pre-examined for the present invention by the present inventors and the highpass filter (HPF) 7 of FIG. 4 according to the preferred embodiment 1 of the present invention.
FIG. 17 is a timing chart showing another cutoff frequency changeover operation in the highpass filter (HPF) 7 of FIG. 4 that is included in the receiver 200 illustrated in FIG. 1 according to the preferred embodiment 1 of the present invention.

Referring to FIG. 17, there is shown a timing chart of another cutoff frequency changeover operation in the highpass filter (HPF) 7 of FIG. 4 that is included in the receiver 200 illustrated in FIG. 1 according to the preferred embodiment 1 of the present invention.

As shown in FIG. 17, a cutoff frequency changeover operation may be performed at time point t003 corresponding to the end of the short training sequence period after completion of gain setting. Further, there may also be provided such an arrangement that a cutoff frequency changeover operation is performed by using a timer included in the receiver 200 illustrated in FIG. 1 according to the present preferred embodiment 1 of the present invention, for example.

In the highpass filter (HPF) 7 shown in FIG. 4 according to the preferred embodiment 1 of the present invention, a cutoff frequency in the first filter including the input capacitor C1X/C1Y and the resistor R1X/R1Y and a cutoff frequency in the second filter including the input capacitor C2X/C2Y and the resistor R2X/R2Y can be adjusted independently through adjustment of respective device element constants. Since the area efficiency of a resistor is higher than that of a capacitor in general terms, it is preferable that the capacitance value of a capacitor should be made smaller wherever applicable. It is to be noted, however, that if the capacitance value of a capacitor is decreased excessively, a decrease in gain may occur due parasitic capacitance, causing an adverse effect on signal receiving characteristics.

<Comparison of Filter Characteristics>

The following compares the filter element constants and characteristics between the highpass filter (HPF) 701 of FIG. 3 that has been pre-examined for the present invention by the present inventors as a highpass filter (HPF) capable of performing a cutoff frequency changeover operation, and the highpass filter (HPF) 7 of FIG. 4 according to the preferred embodiment 1 of the present invention.

Referring to FIG. 16, there is shown a tabular diagram indicating the results of comparison of filter element constants and characteristics between the highpass filter (HPF) 701 of FIG. 3 that has been pre-examined for the present invention by the present inventors and the highpass filter (HPF) 7 of FIG. 4 according to the preferred embodiment 1 of the present invention.

As shown in FIG. 16, it is assumed that a cutoff frequency changeover is made between 1 MHz and 10 kHz.

In the highpass filter (HPF) 7 of FIG. 4 according to the preferred embodiment 1 of the present invention, the input capacitor C1X/C1Y and the input capacitor C2X/C2Y are set to have an equal capacitance value of 10 pF, the resistor R1X/R1Y is set to have a resistance value of 15.92 kilohms, and the resistor R2X/R2Y is set to have a resistance value of 1592 kilohms. Hence, when the first filter including the input capacitor C1X/C1Y and the resistor R1X/R1Y is functionally operative, a cutoff frequency of 1 MHz is set up in the highpass filter (HPF) 7 shown in FIG. 4. Alternatively, when the second filter including the input capacitor C2X/C2Y and the resistor R2X/R2Y is functionally operative, a cutoff frequency of 10 kHz is set up in the highpass filter (HPF) 7.

On the assumption that there is a parasitic capacitance Cp of 1 pF, the passband gain of the highpass filter (HPF) 7 is expressed by "−20 log(1+parasitic capacitance Cp/functional filter capacitance) [dB]". The term "functional filter capacitance" as used herein represents a capacitance value that is provided by a filter in a functionally operative state. Hence, when the higher cutoff frequency is set up, the functional filter capacitance is determined by the input capacitor C1X/C1Y of the first filter, resulting in a passband gain value of −0.8 dB being provided in the highpass filter (HPF) 7. Contrastingly, when the lower cutoff frequency is set up, the functional filter capacitance is determined by the input capacitor C2X/C2Y of the second filter. Since the input capacitor C1X/C1Y and the input capacitor C2X/C2Y are set to have an equal capacitance value, a passband gain value of −0.8 dB is also provided in the highpass filter (HPF) 7 as is the case with the setting of the higher cutoff frequency. Thus, in the use of the highpass filter (HPF) 7 of FIG. 4 according to the preferred embodiment 1 of the present invention, the passband gain thereof remains unchanged before and after a cutoff frequency changeover operation. It is therefore ensured that the cutoff frequency changeover operation brings out no adverse effect on gain setting in the highpass filter (HPF) 7.

In the highpass filter (HPF) 701 of FIG. 3 that has been pre-examined for the present invention by the present inventors, the input capacitor C1X/C1Y is set to have a capacitance value of 10 pF which is the same value as that in the case of FIG. 4, the input capacitor C2X/C2Y is set to have 990 pF which is 99 times larger than the capacitance value of the input capacitor C1X/C1Y, and the resistor RX/RY is set to have a resistance value of 15.92 kilohms. The passband gain of the highpass filter (HPF) 701 shown in FIG. 3 can be calculated in the same manner as for the passband gain of the highpass filter (HPF) 7 shown in FIG. 4. When a higher cutoff frequency of 1 MHz is set up in the highpass filter (HPF) 701 (i.e., when the input capacitor C2X/C2Y is switched off), a passband gain value of −0.8 dB is provided in the highpass filter (HPF) 701. Contrastingly, when a lower cutoff frequency of 10 kHz is set up in the highpass filter (HPF) 701 (i.e., when the input capacitor C2X/C2Y is switched on), a passband gain value of −0.009 dB is provided in the highpass filter (HPF) 701. Thus, in the use of the highpass filter (HPF) 701 shown in FIG. 3, the passband gain thereof varies due to a cutoff frequency changeover operation. Hence, there arises a possibility that the cutoff frequency changeover operation may cause an adverse effect on gain setting in the highpass filter (HPF) 701 of FIG. 3. Further, the highpass filter (HPF) 701 of FIG. 3 requires a capacitance value which is 50 times larger than that in the highpass filter (HPF) 7 of FIG. 4 according to the preferred embodiment 1 of the present invention, i.e., the highpass filter (HPF) 701 of FIG. 3 requires a larger area for providing a larger capacitance value. Unlike the highpass filter (HPF) 701 of FIG. 3, the highpass filter (HPF) 7 according to the preferred embodiment 1 of the present invention is advantageous in that the passband gain thereof remains unchanged before and after a cutoff frequency changeover operation and in that the required area thereof is relatively small.

<Another Highpass Filter>

Figure 7:
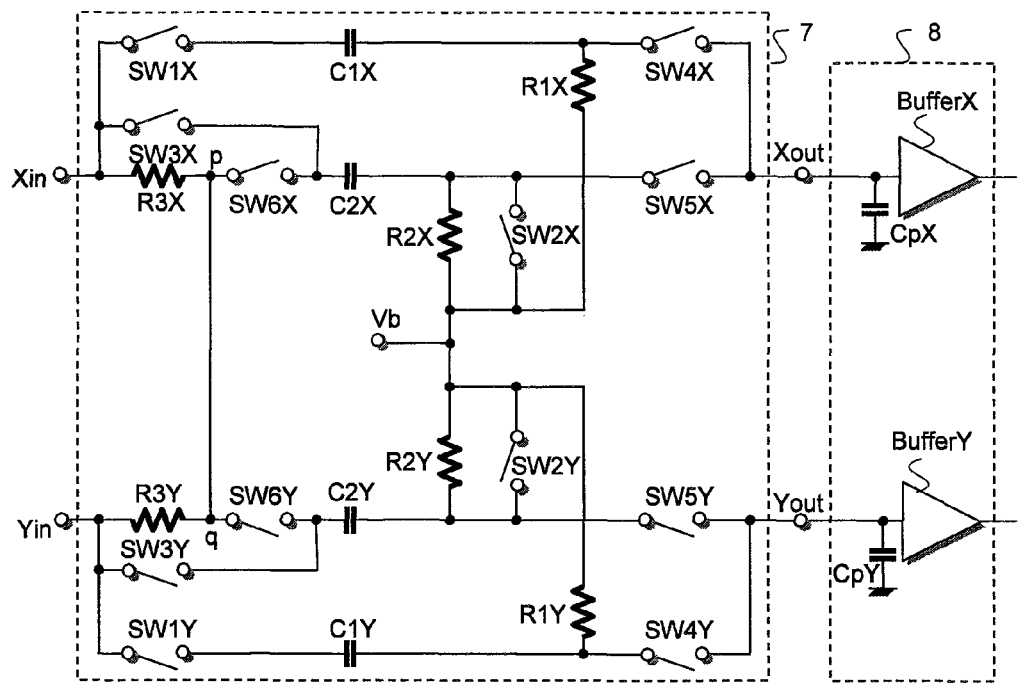
FIG. 7 is a circuit diagram showing another configuration of the highpass filter (HPF) 7 included in the receiver 200 illustrated in FIG. 1 according to the preferred embodiment 1 of the present invention.

Referring to FIG. 7, there is shown another configuration of the highpass filter (HPF) 7 included in the receiver 200 illustrated in FIG. 1 according to the preferred embodiment 1 of the present invention.

The highpass filter (HPF) 7 shown in FIG. 7 is different from the highpass filter (HPF) 7 shown in FIG. 4 in that an additional switch SW6X is coupled between the input resistor R3X and the input capacitor C2X, an additional switch SW6Y is coupled between the input resistor R3Y and the input capacitor C2Y, and an additional short-circuit wiring line is disposed between mutually corresponding end nodes p and q of the respective resistors R3X and R3Y.

In the highpass filter (HPF) 7 shown in FIG. 7, similarly to the highpass filter (HPF) 7 shown in FIG. 4, mutually opposite operations are also performed between the input switch SW1X/SW1Y and the input switch SW3X/SW3Y, between the output switch SW4X/SW4Y and the output switch SW5X/SW5Y, and between the parallel switch SW2X/SW2Y and the input switch SW3X/SW3Y. Further, in the highpass filter (HPF) 7 shown in FIG. 7, a mutually opposite operation is performed between the additional switch SW6X/SW6Y and the input switch SW3X/SW3Y.

More specifically, for setting up the higher cutoff frequency in the first filter of the highpass filter (HPF) 7 shown in FIG. 7, the input switch SW1X/SW1Y, the parallel switch SW2X/SW2Y, the output switch SW4X/SW4Y, and the additional switch SW6X/SW6Y are controllably turned on while the input switch SW3X/SW3Y and the output switch SW5X/SW5Y are controllably turned off. In this state, via the input resistor R3X/R3Y, the short-circuit wiring line between the nodes p and q, and the additional switch SW6X/SW6Y, the input capacitor C2X/C2Y of the second filter is charged at an intermediate bias level of a differential input signal fed from the differential input terminal Xin/Yin.

Contrastingly, for setting up the lower cutoff frequency in the second filter of the highpass filter (HPF) 7 shown in FIG. 7, the input switch SW1X/SW1Y, the parallel switch SW2X/SW2Y, the output switch SW4X/SW4Y, and the additional switch SW6X/SW6Y are controllably turned off while the input switch SW3X/SW3Y and the output switch SW5X/SW5Y are controllably turned on.

In the case of setting up the higher cutoff frequency in the highpass filter (HPF) 7 shown in FIG. 4, the bias level of the differential input signal fed from the differential input terminal Xin/Yin via the input resistor R3X/R3Y and the bias voltage Vb are applied across the input capacitor C2X/C2Y of the second filter. Thus, in the highpass filter (HPF) 7 shown in FIG. 4, when the input capacitor C2X/C2Y of the second filter is charged, a lowpass filter (LPF) function is provided by the input resistor R3X/R3Y and the input capacitor C2X/C2Y, thereby absorbing a difference voltage appearing at the differential input terminal Xin/Yin.

However, in the highpass filter (HPF) 7 shown in FIG. 4, if an excessive different input amplitude is present at the differential input terminal Xin/Yin, there is a possibility that a significant magnitude of DC offset may occur appreciably depending on the difference input amplitude at the time of a changeover from the higher cutoff frequency to the lower cutoff frequency.

Contrastingly, in the highpass filter (HPF) 7 shown in FIG. 7, when the high cutoff frequency is set up, one end of the input capacitor C2X and one end of the input capacitor C2Y are common-coupled respectively to the nodes p and q on the additional short-circuit wiring line via the switches SW6X and SW6Y in a turned-on state. Hence, a potential at the node p/q is determined based on the midpoint of voltage dividing through the input resistor R3X/R3Y with respect to a difference input amplitude at the differential input terminal Xin/Yin. With the other end of each of the input capacitors C2X and C2Y coupled to the bias voltage Vb, the input capacitors C2X and C2Y are subjected to charging. Consequently, even if a difference input amplitude is present at the differential input terminal Xin/Yin, the nodes p and q are set at an equipotential level through the additional short-circuit wiring line disposed therebetween. Thus, though with an equipotential DC offset component remaining, it is possible to charge the capacitor C2 in the condition that the dependency on a difference input amplitude is alleviated.

As can be seen from the above description, by using the highpass filter (HPF) 7 of FIG. 7 in the receiver 200 shown in FIG. 1 according to the preferred embodiment 1 of the present invention, it is possible to provide gain settlement at high speed and reduction in DC offset during the short training sequence period specified in the wireless LAN standard IEEE 802.11a.

<Still Another Highpass Filter>

Figure 8:
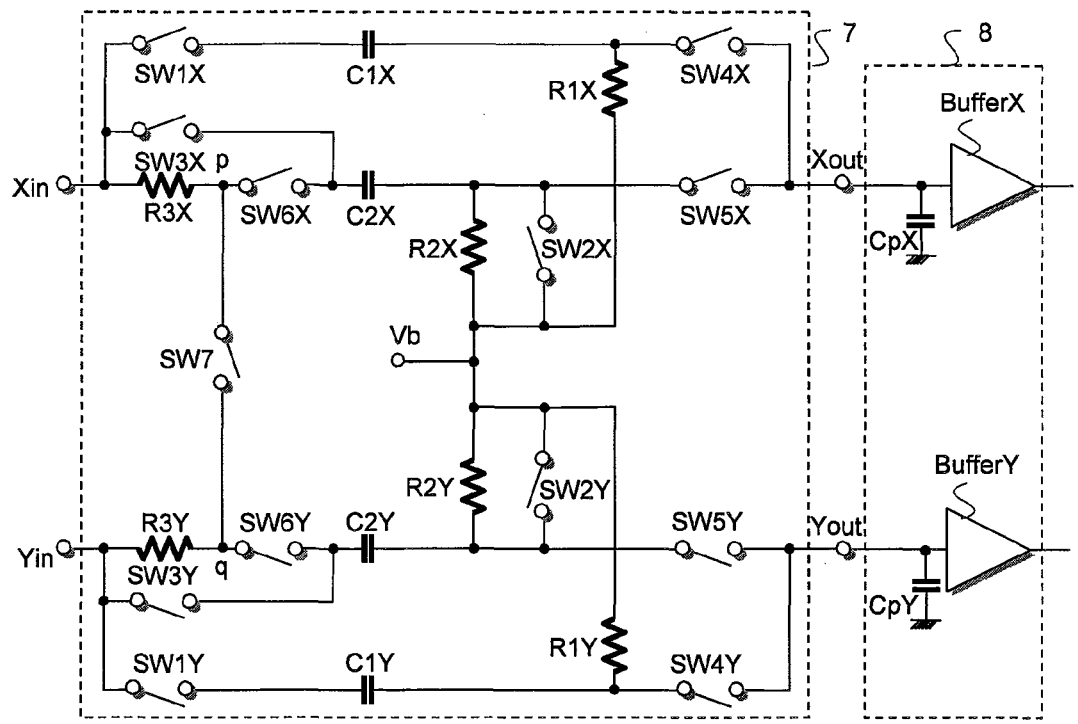
FIG. 8 is a circuit diagram showing still another configuration of the highpass filter (HPF) 7 included in the receiver 200 illustrated in FIG. 1 according to the preferred embodiment 1 of the present invention.

Referring to FIG. 8, there is shown still another configuration of the highpass filter (HPF) 7 included in the receiver 200 illustrated in FIG. 1 according to the preferred embodiment 1 of the present invention.

The highpass filter (HPF) 7 shown in FIG. 8 is different from the highpass filter (HPF) 7 shown in FIG. 7 in that an additional switch SW7 is disposed on a line between the nodes p and q in lieu of the short-circuit wiring line indicated in FIG. 7.

The additional switch SW7 in the highpass filter (HPF) 7 shown in FIG. 8 is turned on/off under direction of the control logic section 10 included in the receiver 200 illustrated in FIG. 1 according to the preferred embodiment 1 of the present invention.

When the additional switch SW7 in the highpass filter (HPF) 7 shown in FIG. 8 is controllably turned off, there is formed a circuit configuration which is functionally equivalent to that of the highpass filter (HPF) 7 shown in FIG. 4. Alternatively, when the additional switch SW7 shown in FIG. 8 is controllably turned on, there is formed a circuit configuration which is functionally equivalent to that of the highpass filter (HPF) 7 shown in FIG. 7. That is, in the highpass filter (HPF) 7 shown in FIG. 8, by turning off/on the additional switch SW7, a selection can be made between the circuit configuration equivalent to that of the highpass filter (HPF) 7 shown in FIG. 4 and the circuit configuration equivalent to that of the highpass filter (HPF) 7 shown in FIG. 7.

In the highpass filter (HPF) 7 shown in FIG. 4, when a DC offset value at a circuit stage anterior thereto is relatively large and an input amplitude is relatively small, it is possible to reduce DC offset due to a cutoff frequency changeover with high efficiency as compared with the highpass filter (HPF) 7 shown in FIG. 7. Contrastingly, in the highpass filter (HPF) 7 shown in FIG. 7, DC offset at a circuit stage anterior thereto is likely to appear in output though DC offset attributable to an input amplitude at the time of a cutoff frequency changeover can be reduced. Hence, in the highpass filter (HPF) 7 shown in FIG. 8, when it is predicted that a DC offset value at a circuit stage anterior thereto is relatively large and an input amplitude is relatively small, the additional switch SW7 is controllably turned off to form a circuit configuration equivalent to that of the highpass filter (HPF) 7 shown in FIG. 4. Alternatively, in the highpass filter (HPF) 7 shown in FIG. 8, when it is predicted that a DC offset value at the anterior circuit stage is relatively small and an input amplitude is relatively large, the additional switch SW7 is controllably turned on to form a circuit configuration equivalent to that of the highpass filter (HPF) 7 shown in FIG. 7.

As mentioned above, in the highpass filter (HPF) 7 shown in FIG. 8, the additional switch SW7 is controllably turned off/on in accordance with a DC offset condition at the anterior circuit stage and an input signal amplitude condition. Thus, a selection is made between the circuit configuration equivalent to the highpass filter (HPF) 7 shown in FIG. 4 that is capable of performing highly efficient removal of DC offset components due to a cutoff frequency changeover, and the circuit configuration equivalent to the highpass filter (HPF) 7 shown in FIG. 7 that is capable of reducing DC offset attributable to an input amplitude at the time of a cutoff frequency changeover. As regards the timing of selection between these circuit configurations, there may be provided such an arrangement that an input amplitude level is determined in accordance with a signal indicating the end of gain setting that is received from another IC, for example. More specifically, a threshold value or the like is provided for gain setting in the programmable gain amplifier (PGA) or the low noise amplifier (LNA) that is operative with a control signal or the like from the control logic section 10, and then, in accordance with the threshold value or the like, the additional switch SW7 in the highpass filter (HPF) 7 shown in FIG. 8 is controllably turned off/on to make a proper selection between the circuit configuration equivalent to that shown in FIG. 4 and the circuit configuration equivalent to that shown in FIG. 7.

As can be seen from the above description, the use of the highpass filter (HPF) 7 shown in FIG. 8 makes it possible to realize high-speed gain changeover and DC offset removal even in a wireless communication system having a requirement for a relatively short gain setting period such as a wireless LAN system. Further, since the highpass filter (HPF) 7 shown in FIG. 8 allows a configurational selection to be made in accordance with an input amplitude level and a DC offset value, it is possible to ensure reliable removable of DC offset. In addition, on account of the advantage that most of configurations shown in FIGS. 4 and 7 can be arranged for use in common, the arrangement of the highpass filter (HPF) 7 shown in FIG. 8 enables provision of a small area feature for the receiver 200.

While a configurational selection is made in the highpass filter (HPF) 7 shown in FIG. 8 through detection of an input amplitude level and a DC offset value as described above, there may also be provided a modified arrangement wherein a configurational selection in the highpass filter (HPF) 7 shown in FIG. 8 is performed at a predetermined time by using a timer.

Preferred Embodiment 2

Another Receiver Configuration

Figure 9:
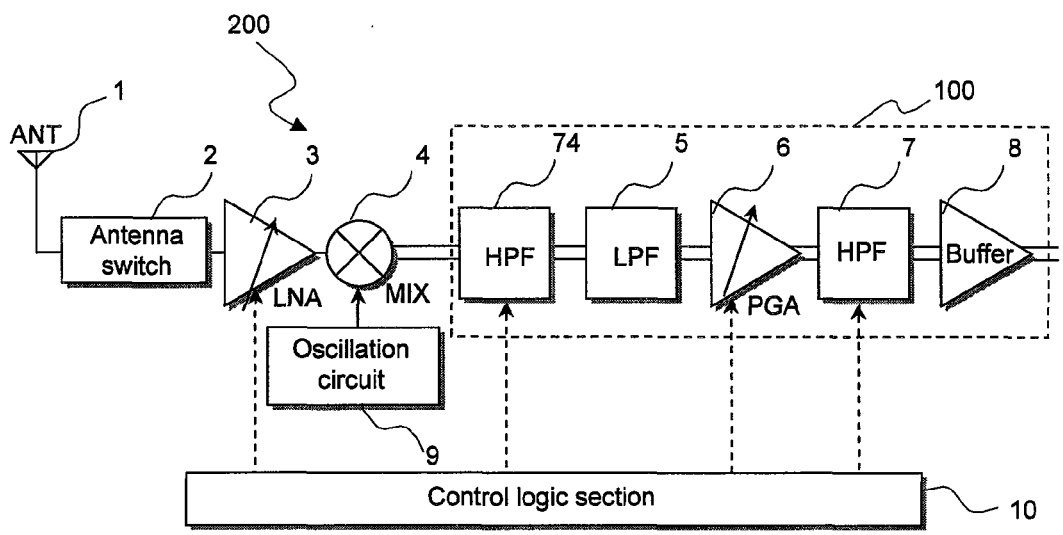
FIG. 9 is a schematic block diagram showing a configuration of another receiver 200 according to a preferred embodiment 2 of the present invention.

Referring to FIG. 9, there is shown a configuration of another receiver 200 according to a preferred embodiment 2 of the present invention.

The receiver 200 shown in FIG. 9 according to the preferred embodiment 2 of the present invention is different from the receiver 200 shown in FIG. 1 according to the preferred embodiment 1 of the present invention in that there is additionally provided a highpass filter (HPF) 74 at a stage anterior to the lowpass filter (LPF) 5.

It is to be noted that, in the receiver 200 shown in FIG. 9 according to the preferred embodiment 2 of the present invention, the low noise amplifier (LNA) 3 is arranged to perform a gain changeover under direction of the control logic section 10.

In the receiver 200 according to the aforementioned preferred embodiment 1 of the present invention, DC offset in output from the mixer (MIX) 4 is increased due to a gain in the programmable gain amplifier (PGA) 6. Hence, if there occurs large DC offset at a gain changeover of the low noise amplifier (LNA) 3 or due to flicker noise or self-mixing in the mixer (MIX) 4, an amplifier circuit included in the programmable gain amplifier (PGA) 6 may be saturated. The occurrence of a saturated operation in the programmable gain amplifier (PGA) 6 causes degradation in quality of a baseband signal produced as an output from the programmable gain amplifier (PGA) 6.

In consideration of the above, the highpass filter (HPF) 74 is additionally disposed at a stage anterior to the lowpass filter (LPF) 5 in the receiver 200 shown in FIG. 9 according to the preferred embodiment 2 of the present invention. The highpass filter (HPF) 74 disposed at the stage anterior to the lowpass filter (LPF) 5 is configured basically in the same fashion as the highpass filter (HPF) 7 disposed at a stage posterior to the lowpass filter (LPF) 5. With respect to an input, the timing of charging an input capacitor C2X/C2Y in the anterior-stage highpass filter (HPF) 74 is preset to be earlier than that of charging the input capacitor C2X/C2Y in the posterior-stage highpass filter (HPF) 7. Further, the timing of a cutoff frequency changeover in the anterior-stage highpass filter (HPF) 74 is also preset to be earlier than that of a cutoff frequency changeover in the posterior-stage highpass filter (HPF) 7.

An RF signal received by the antenna 1 is fed to a semiconductor integrated circuit for signal reception via the antenna switch 2, and then amplified by the low noise amplifier (LNA) 3 capable of performing a gain changeover. Thereafter, through the mixer (MIX) 4, the RF signal is mixed with a local frequency signal supplied from the oscillation circuit 9 for direct down-conversion to a baseband signal. The baseband signal thus obtained is fed to the anterior-stage highpass filter (HPF) 74 for removal of DC offset components or the like incurred in the low noise amplifier (LNA) 3 and the mixer (MIX) 4. Then, the baseband signal is fed to the lowpass filter (LPF) 5 for removal of interference adjacent channel signals. Then, the baseband signal is subjected to gain setting by the programmable gain amplifier (PGA) 6 so as to provide a desired level. Through the posterior-stage highpass filter (HPF) 7, DC offset and flicker noise due to a gain changeover is removed from the baseband signal, and then the baseband signal is output via the buffer 8.

The circuit configuration of the highpass filter (HPF) 7 shown in FIG. 4 is adopted for each of the anterior-stage highpass filter (HPF) 74 and the posterior-stage highpass filter (HPF) 7 included in the receiver shown in FIG. 9 according to the preferred embodiment 2 of the present invention. The anterior-stage highpass filter (HPF) 74 coupled to the output of the mixer (MIX) 4 is preset to have a charging time constant smaller than that of the posterior-stage highpass filter (HPF) 7 coupled to the output of the programmable gain amplifier (PGA) 6. Since the charging time constant of the anterior-stage highpass filter (HPF) 74 is relatively small, a filtering operation thereof and a charging operation for the input capacitor C2X/C2Y thereof are performed at higher speed though DC offset attributable to an input amplitude at the time of a cutoff frequency changeover increases at the charging of the input capacitor C2X/C2Y. The anterior-stage highpass filter (HPF) 74 provides an input amplitude which is smaller than that of the posterior-stage highpass filter (HPF) 7 correspondingly to a gain value in the programmable gain amplifier (PGA) 6. Hence, regarding DC offset attributable to an input amplitude at the time of a cutoff frequency changeover in the anterior-stage highpass filter (HPF) 74, there arises no significant disadvantage even if the charging time constant of the anterior-stage highpass filter (HPF) 74 is smaller than that of the posterior-stage highpass filter (HPF) 7. More specifically, the charging time constant of each of the anterior-stage highpass filter (HPF) 74 and the posterior-stage highpass filter (HPF) 7 is determined by the values of the input capacitor C2X/C2Y and the input resistor R3X/R3Y. Thus, as described above, by adjusting the values of the input capacitor C2X/C2Y and the input resistor R3X/R3Y, the anterior-stage highpass filter (HPF) 74 is preset to have a charging time constant smaller than that of the posterior-stage highpass filter (HPF) 7.

<Changeover Operation of Cutoff Frequency>

Figure 10:
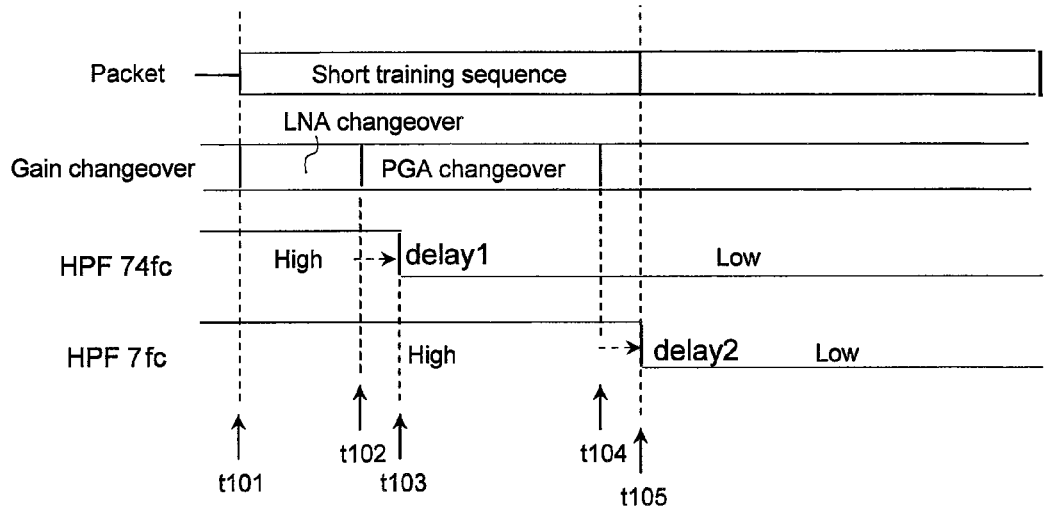
FIG. 10 is a timing chart showing a cutoff frequency changeover operation in the highpass filter (HPF) 7 of FIG. 4 that is included in the receiver 200 shown in FIG. 9 according to the preferred embodiment 2 of the present invention.

Referring to FIG. 10, there is shown a timing chart of a cutoff frequency changeover operation in the highpass filter (HPF) 7 of FIG. 4 that is included in the receiver 200 shown in FIG. 9 according to the preferred embodiment 2 of the present invention.

During the short training sequence period (from time point t101 to time point t105) for packet communication, a gain setting operation is carried out in each of the low noise amplifier (LNA) 3 and the programmable gain amplifier (PGA) 6 as shown in FIG. 10.

First, at time point t101, a higher cutoff frequency is set up in each of the anterior-stage highpass filter (HPF) 74 and the posterior-stage highpass filter (HPF) 7. In the low noise amplifier (LNA) 3, a gain setting operation is started to initiate the charging of the input capacitor C2X/C2Y in each of the anterior-stage highpass filter (HPF) 74 and the posterior-stage highpass filter (HPF) 7.

Then, at time point t102, the gain setting operation in the low noise amplifier (LNA) 3 is completed. Using a delay period 1 (delay 1) from time point t102 to time point t103, the anterior-stage highpass filter (HPF) 74 carries out a cutoff frequency changeover from the higher cutoff frequency to a lower cutoff frequency by time point t103. Resultantly, the time constant of the anterior-stage highpass filter (HPF) 74 becomes smaller than that of the posterior-stage highpass filter (HPF) 7 to enable higher-speed charging of the input capacitor C2X/C2Y, contributing to enhancement in operation speed. Then, at time point t104, the gain setting operation in the programmable gain amplifier (PGA) 6 is completed. Using a delay period 2 (delay 2) from time point t104 to time point t105, the posterior-stage highpass filter (HPF) 7 carries out a cutoff frequency changeover from the high cutoff frequency to a low cutoff frequency by time point t105.

As regards the timing of a cutoff frequency changeover in each of the anterior-stage highpass filter (HPF) 74 and the posterior-stage highpass filter (HPF) 7, the delay period 1 (delay 1) from time point t102 to time point t103 is used after completion of gain setting in the low noise amplifier (LNA) 3, and the delay period 2 (delay 2) from time point t104 to time point t105 is used after completion of gain setting in the programmable gain amplifier (PGA) 6. The delay period 1 (delay 1) and the delay period 2 (delay 2) are provided for ensuring settlement of DC offset due to a gain changeover, and it is preferable to shorten these delay periods. It is to be noted, however, that the delay period 1 (delay 1) and the delay period 2 (delay 2) should be adjusted properly according to such factors as a changeover timing point, amplitude, frequency, and charging time constant. For instance, in cases where DC offset remains unchanged before and after a gain changeover in the low noise amplifier (LNA) 3, there may be provided such a timing sequence that the delay period 1 (delay 1) from time point t102 to time point t103 is eliminated or the delay period 2 (delay 2) is shortened. Likewise, in cases where DC offset due to a gain changeover in the low noise amplifier (LNA) 3 is relatively large, there may also be provided such a timing sequence that the delay period 1 (delay 1) is prolonged.

Where a relatively small charging time constant is preset, an error corresponding to an input amplitude is contained in the amount of charge applied to the input capacitor C2X/C2Y, resulting in an increase in DC offset due to a cutoff frequency changeover. However, in an application to a communication system wherein the input amplitude of the mixer (MIX) 4 is limited to a range below a predetermined level depending on gain setting in the low noise amplifier (LNA) 3, a decrease in charging time constant is advantageous since the dependency on an input amplitude becomes relatively smaller.

In the configuration of the receiver 200 shown in FIG. 9 according to the preferred embodiment 2 of the present invention, DC offset in the low noise amplifier (LNA) 3 or the mixer (MIX) 4 is removed by the anterior-stage highpass filter (HPF) 74 having an excellent responsivity to prevent propagation to the programmable gain amplifier (PGA) 6, and DC offset due to amplification in the programmable gain amplifier (PGA) 6 is removed by the posterior-stage highpass filter (HPF) 7. Thus, even in a situation where large offset occurs in the low noise amplifier (LNA) 3 or the mixer (MIX) 4, the DC offset removal function of the anterior-stage highpass filter (HPF) 74 makes it possible to reduce the degree of possibility of saturation in the programmable gain amplifier (PGA) 6.

As regards the end timing of gain setting in the low noise amplifier (LNA) 3 at time point t102 during the short training sequence period shown in FIG. 10, there may be provided such an arrangement that a signal indicating the end of gain setting is received from an external control IC for transmission/reception control or gain setting execution, and that the end of gain setting is determined through addition of a certain delay period value to a time point value of reception of the above signal. Alternatively, there may also be provided such an arrangement that the end of gain setting is judged by the control logic section 10.

While two highpass filters (HPFs), i.e., the anterior-stage highpass filter (HPF) 74 and the posterior-stage highpass filter (HPF) 7 are included in the receiver 200 shown in FIG. 9 according to the preferred embodiment 2 of the present invention, it is to be noted that the present invention is not particularly limited thereto. For example, there may also be provided a modified arrangement wherein a plurality of highpass filters (HPFs) are cascade-coupled and a anterior-stage highpass filter (HPF) is preset to have a charging time constant smaller than that of a posterior-stage highpass filter (HPF).

It is also to be noted that the configurations of the highpass filters (HPFs) 7 shown in FIGS. 7 and 8 as well as the configuration of the highpass filter (HPF) 7 shown in FIG. 4 are applicable to the anterior-stage highpass filter (HPF) 74 and the posterior-stage highpass filter (HPF) 7 included in the receiver 200 shown in FIG. 9 according to the preferred embodiment 2 of the present invention.

In the case where the anterior-stage highpass filter (HPF) 74 is changed over from the high cutoff frequency to the lower cutoff frequency, the higher cutoff frequency in the posterior-stage highpass filter (HPF) 7 is preset to be higher than the lower cutoff frequency in the anterior-stage highpass filter (HPF) 74. More specifically, at time point t103 indicated in FIG. 10 corresponding to the timing of a cutoff frequency changeover in the anterior-stage highpass filter (HPF) 74, DC offset due to the cutoff frequency changeover appears on the output side of the anterior-stage highpass filter (HPF) 74. Hence, the posterior-stage highpass filter (HPF) 7 responds to the DC offset appearing on the output side of the anterior-stage highpass filter (HPF) 74. At this step, the convergence time of response by the posterior-stage highpass filter (HPF) 7 is inversely proportional to a cutoff frequency selected in the posterior-stage highpass filter (HPF) 7. Since the higher cutoff frequency in the posterior-stage highpass filter (HPF) 7 is preset to be higher than the lower cutoff frequency in the anterior-stage highpass filter (HPF) 74 as mentioned above, the posterior-stage highpass filter (HPF) 7 is responsive at high speed to enable high-speed removal of DC offset in the posterior-stage highpass filter (HPF) 7.

Preferred Embodiment 3

Still Another Receiver Configuration

Figure 11:
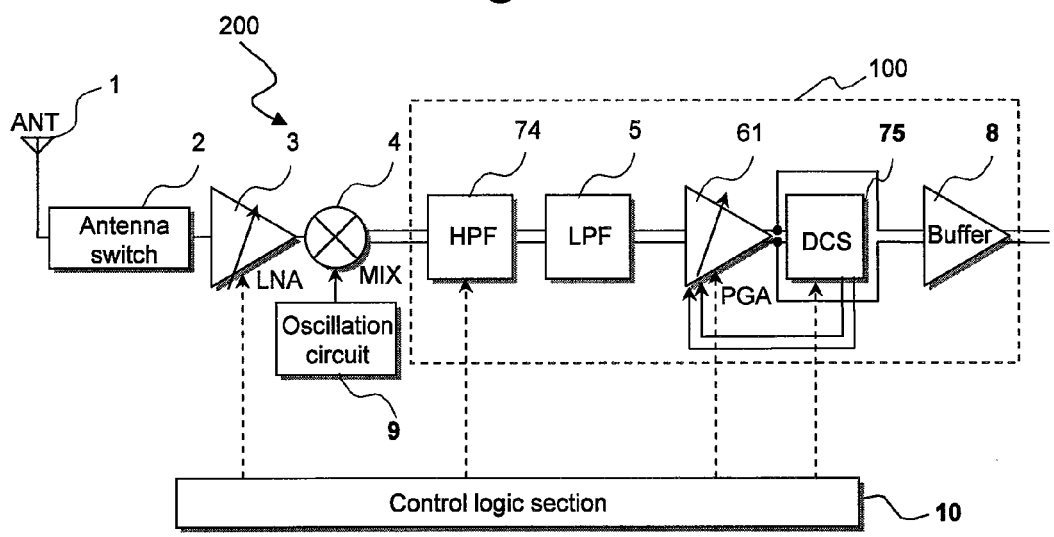
FIG. 11 is a schematic block diagram showing a configuration of still another receiver 200 according to a preferred embodiment 3 of the present invention.

Referring to FIG. 11, there is shown a configuration of still another receiver 200 according to a preferred embodiment 3 of the present invention.

The receiver 200 shown in FIG. 11 according to the preferred embodiment 3 of the present invention is different from the receiver 200 shown in FIG. 9 according to the preferred embodiment 2 of the present invention in that a programmable gain amplifier (PGA) 61 and a DC servo circuit (DCS) 75 are provided in lieu of the programmable gain amplifier (PGA) 6 and the posterior-stage highpass filter (HPF) 7 included in the receiver 200 shown in FIG. 9, respectively.

The DC servo circuit (DSC) 75, included in the receiver 200 shown in FIG. 11 according to the preferred embodiment 3 of the present invention, comprises an integrator functioning as a lowpass filter (LPF). The programmable gain amplifier (PGA) 61 comprises an adder and a variable gain amplifying circuit. One input terminal of the adder is supplied with an output signal from the lowpass filter (LPF) 5, and the other input terminal of the adder is supplied with reversed-phase signal integration result data on a negative feedback basis from the DC servo circuit (DCS) 75 functioning as a lowpass filter (LPF). Thus, in the receiver 200 shown in FIG. 11 according to the preferred embodiment 3 of the present invention, the programmable gain amplifier (PGA) 61 and the DC servo circuit (DCS) 75 are arranged to function as a highpass filter (HPF) that is supplied with an output signal from the lowpass filter (LPF) 5.

<Programmable Gain Amplifier and DC Servo Circuit>

Figure 12:
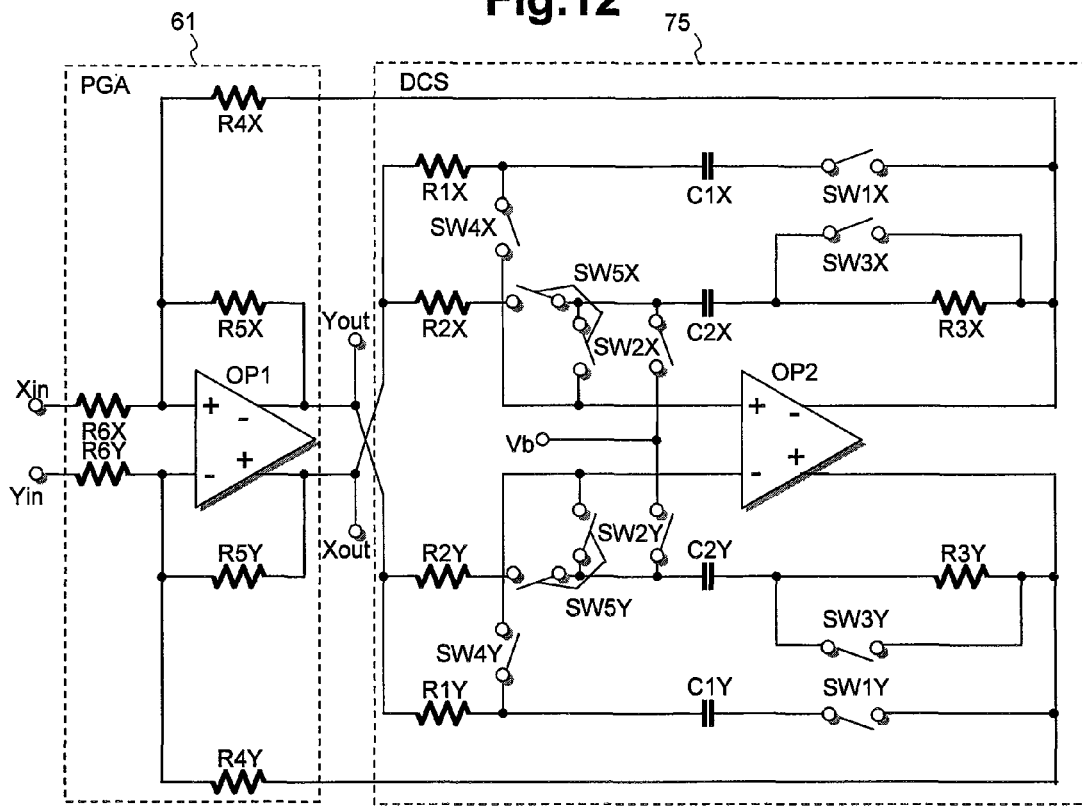
FIG. 12 is a circuit diagram showing an exemplary configuration of a programmable gain amplifier (PGA) 61 and a DC servo circuit (DCS) 75 included in the receiver 200 illustrated in FIG. 11 according to the preferred embodiment 3 of the present invention.

Referring to FIG. 12, there is shown a circuit diagram of an exemplary configuration of the programmable gain amplifier (PGA) 61 and the DC servo circuit (DCS) 75 included in the receiver 200 illustrated in FIG. 11 according to the preferred embodiment 3 of the present invention.

The programmable gain amplifier (PGA) 61 includes first input resistors R6X and R6Y, second input resistors R4X and R4Y, negative feedback resistors R5X and R5Y, and an operational amplifier OP1. A non-inverted input terminal (+) and an inverted input terminal (−) of the operational amplifier OP1 are coupled with differential input terminals Xin and Yin via the first input resistors R6X and R6Y, respectively, and the differential input terminals Xin and Yin are supplied with a differential output signal from the lowpass filter (LPF) 5. Via the second input resistors R4X and R4Y, the non-inverted input terminal (+) and the inverted input terminal (−) of the operational amplifier OP1 are supplied with reversed-phased differential signal integration result data on a negative feedback basis from the DC servo circuit (DCS) 75 functioning as a lowpass filter (LPF). The negative feedback resistors R5X and R5Y are coupled between the non-inverted input terminal (+) and an inverted output terminal (−) of the operational amplifier OP1 and between the inverted input terminal (−) and a non-inverted output terminal (+) thereof, respectively.

The DC servo circuit (DCS) 75 itself is an integrator functioning as a lowpass filter (LPF) which is functionally opposite to the highpass filter (HPF) 7 shown in FIG. 4 according to the preferred embodiment 1 of the present invention.

Similarly to the highpass filter (HPF) 7 shown in FIG. 4, the DC servo circuit (DCS) 75 shown in FIG. 12 includes resistors R1X and R1Y, resistors R2X and R2Y, resistors R3X and R3Y, capacitors C1X and C1Y, capacitors C2X and C2Y, and switches SW1X, SW1Y, SW2X, SW2Y, SW3X, SW3Y, SW4X, SW4Y, SW5X, and SW5Y. In the DC servo circuit (DCS) 75 shown in FIG. 12, however, the resistor R1X/R1Y and the resistor R2X/R2Y are coupled to the differential input terminal side of the DC servo circuit (DCS) 75 while the capacitor C1X/C1Y and the capacitor C2X/C2Y are coupled to the differential output terminal side thereof, in a form of arrangement opposite to that of the highpass filter (HPF) 7 shown in FIG. 4. Thus, the DC servo circuit (DCS) 75 itself is an integrator functioning as a lowpass filter (LPF). It is to be noted that the DC servo circuit (DCS) 75 is operative as an active filter since an operational amplifier OP2 is included therein.

A highpass filter (HPF) formed of the programmable gain amplifier (PGA) 61 and the DC servo circuit (DCS) 75 shown in FIG. 12 according to the preferred embodiment 3 of the present invention performs operations similar to those of the highpass filter (HPF) 7 shown in FIG. 4 according to the preferred embodiment 1 of the present invention.

More specifically, in the circuit configuration shown in FIG. 12, for setting up a higher cutoff frequency of a first filter serving as a highpass filter (HPF), the output switch SW1X/SW1Y, the bias switch SW2X/SW2Y, and the input switch SW4X/SW4Y are controllably turned on while the output switch SW3X/SW3Y and the input switch SW5X/SW5Y are controllably turned off. In this state, the output capacitor C2X/C2Y included in a second filter is charged via the output resistor R3X/R3Y at a level of voltage fed from an inverted output terminal (−)/non-inverted output terminal (+) of the operational amplifier OP2.

Contrastingly, in the circuit configuration shown in FIG. 12, for setting up a lower cutoff frequency of the second filter serving as a highpass filter (HPF), the output switch SW1X/SW1Y, the bias switch SW2X/SW2Y, and the input switch SW4X/SW4Y are controllably turned off while the output switch SW3X/SW3Y and the input switch SW5X/SW5Y are controllably turned on.

As mentioned above, the DC servo circuit (DCS) 75 shown in FIG. 12 according to the preferred embodiment 3 of the present invention includes the resistors R1X and R1Y, resistors R2X and R2Y, output resistors R3X and R3Y, output capacitors C1X, C1Y, C2Y and C2Y, output switches SW1X and SW1Y, bias switches SW2X and SW2Y, output switches SW3X and SW3Y, input switches SW4X, SW4Y, SW5X, and SW5Y, and operational amplifier OP2.

For setting up the higher cutoff frequency, the resistor R1X/R1Y and the output capacitor C1X/C1Y are selected. Alternatively, for setting up the lower cutoff frequency, the resistor R2X/R2Y and the output capacitor C2X/C2Y are selected.

A first cutoff frequency is determined by a first integrator including the resistor R1X/R1Y, the capacitor C1X/C1Y, and the operational amplifier OP2, the second input resistor R4X/R4Y, the negative feedback resistor R5X/R5Y, and the operational amplifier OP1. A second cutoff frequency is determined by a second integrator including the resistor R2X/R2Y, the capacitor C2X/C2Y, and the operational amplifier OP2, the second input resistor R4X/R4Y, the negative feedback resistor R5X/R5Y, and the operational amplifier OP1. The first cutoff frequency is set to be higher than the second cutoff frequency (on the order of 100 times, for example). Thus, the first integrator is made operative for setting up the higher cutoff frequency, and the second integrator is made operative for setting up the lower cutoff frequency. Via the input switch SW4X/SW4Y, one end of the resistor R1X/R1Y is coupled to the non-inverted input terminal (+)/inverted input terminal (−) of the operational amplifier OP2, and the other end of the resistor R1X/R1Y is coupled to the output terminal Xout/Yout of the programmable gain amplifier (PGA) 61. One end of the capacitor C1X/C1Y is coupled to the resistor R1X/R1Y, the other end of the capacitor C1X/C1Y is coupled to the inverted output terminal (−)/non-inverted output terminal (+) of the operational amplifier OP2 via the output switch SW1X/SW1Y. One end of the resistor R2X/R2Y is coupled to the non-inverted input terminal (+)/inverted input terminal (−) of the operational amplifier OP2 via the input switch SW5X/

SW5Y, and the other end of the resistor R2X/R2Y is coupled to the output terminal Xout/Yout of the programmable gain amplifier (PGA) 61.

The output resistor R3X/R3Y and the output switch SW3X/SW3Y are coupled in parallel. At the time of charging the capacitor C2X/C2Y, the output resistor R3X/R3Y is series-coupled between one end of the capacitor C2X/C2Y and the inverted output terminal (−)/non-inverted output terminal (+) of the operational amplifier OP2. Simultaneously, in the above charging, the other end of the capacitor C2X/C2Y is fed with bias voltage Vb via the parallel switch SW2X/SW2Y coupled to the resistor R2X/R2Y.

In the programmable gain amplifier (PGA) 61 shown in FIG. 12, an adder is formed of the first input resistor R6X/R6Y, the second input resistor R4X/R4Y, the negative feedback resistor R5X/R5Y, and the operational amplifier OP1. In an instance where the second input resistor R4X/R4Y and the negative feedback resistor R5X/R5Y are arranged to provide a resistance value ratio of 1:1, a cutoff frequency in a highpass filter (HPF) formed of the DC servo circuit (DCS) 75 and the programmable gain amplifier (PGA) 61 is determined as described below:

In the highpass filter (HPF) formed of the DC servo circuit (DCS) 75 and the programmable gain amplifier (PGA) 61, a cutoff frequency is determined by turning on/off the switches SW1X, SW1Y, SW2X, SW2Y, SW3X, SW3Y, SW4X, SW4Y, SW5X, and SW5Y. Thus, an integration constant in the DC servo circuit (DCS) 75 is determined according to either an integration constant specified by the resistor R1X/R1Y and the capacitor C1X/C1Y or an integration constant specified by the resistor R2X/R2Y and the capacitor C2X/C2Y.

Hence, in cases where it is desired to decrease the sizes of capacitors and resistors for reduction in the chip area of a semiconductor integrated circuit configuring the receiver 200 shown in FIG. 11 according to the preferred embodiment 3 of the present invention, it is allowed to adjust the resistance value ratio of the second input resistor R4X/R4Y to the negative feedback resistor R5X/R5Y. Through this adjustment, a cutoff frequency can be altered as required. For instance, to decrease the cutoff frequency to ½ without changing the capacitance values/sizes of the capacitors concerned and the resistance values/sizes of the resistors concerned, there may be provided such a configurational arrangement that the resistance value ratio of the second input resistance R4X/R4Y to the negative feedback resistor R5X/R5Y is expressed as "R4:R5=1:2". By providing this configurational arrangement, the cutoff frequency can be adjusted based on the resistance value ratio of the second input resistor R4X/R4Y to the negative feedback resistor R5X/R5Y. By way of contrast, the amount of DC suppression is determined based on the product of the DC gain of the operational amplifier OP2 and the resistance value ratio of the second input resistor R4X/R4Y to the negative feedback resistor R5X/R5Y. Where the resistance value ratio of the second input resistor R4X/R4Y to the negative feedback resistor R5X/R5Y is expressed as "R4:R5=1:2", the amount of DC suppression is decreased to ½, which is not problematic since the DC gain of the operational amplifier OP2 is sufficiently large in common applications.

The gain of the programmable gain amplifier (PGA) 61 is determined based on the resistance value ratio of the negative feedback resistor R5X/R5Y to the first input resistor R6X/R6Y. Hence, the gain of the programmable gain amplifier (PGA) 61 can be adjusted by changing the resistance value of the first input resistor R6X/R6Y. Since the resistance value ratio of the second input resistor R4X/R4Y to the negative feedback resistor R5X/R5Y is kept constant, it is possible to keep the cutoff frequency constant even when the gain of the programmable gain amplifier (PGA) 61 is varied.

In the circuit configuration shown in FIG. 12, the switches SW1X/SW1Y, SW2X/SW2Y, and SW4X/SW4Y perform operations opposite to those of the switches SW3X/SW3Y and SW5X/SW5Y. More specifically, for setting up the higher cutoff frequency, the switches SW1X/SW1Y, SW2X/SW2Y, and SW4X/SW4Y are controllably turned on while the switches SW3X/SW3Y and SW5X/SW5Y are controllably turned off. In this state, the capacitor C2X/C2Y is charged via the resistor R3X/R3Y. For setting up the lower cutoff frequency, the switches SW1X/SW1Y, SW2X/SW2Y, and SW4X/SW4Y are controllably turned off while the switches SW3X/SW3Y and SW5X/SW5Y are controllably turned on.

In the programmable gain amplifier (PGA) 61 and the DC servo circuit (DCS) 75 shown in FIG. 12 according to the preferred embodiment 3 of the present invention, similarly to the highpass filter (HPF) 7 shown in FIG. 4, the switches SW1X/SW1Y, SW2X/SW2Y, and SW4X/SW4Y are controllably turned on while the switches SW3X/SW3Y and SW5X/SW5Y are controllably turned off for shortening a time required for gain settlement. In this state, the higher cutoff frequency is set up since the DC servo circuit (DCS) 75 is component-wise operative with the resistor R1X/R1Y and the capacitor C1X/C1Y. In the case of setting up the higher cutoff frequency, one end of the capacitor C2X/C2Y is fed with a voltage level from the inverted output terminal (−)/non-inverted output terminal (+) of the operational amplifier OP2 via the resistor R3X/R3Y, and the other end of the capacitor C2X/C2Y is fed with the bias voltage Vb via the switch SW2X/SW2Y. Thus, the capacitor C2X/C2Y is quick-charged. At the time of this quick-charging, since the capacitor C2X/C2Y is charged via the resistor R3X/R3Y, a lowpass filter (LPF) function is provided. Hence, a certain time constant is involved in the charging of the capacitor C2X/C2Y so as to absorb DC offset appearing at the differential input terminal Xin/Yin. Thus, DC offset voltage charging can be performed without dependency on a filter input amplitude level.

Then, upon completion of gain setting, a cutoff frequency changeover operation is performed. For a changeover to the lower cutoff frequency, the switches SW1X/SW1Y, SW2X/SW2Y, and SW4X/SW4Y are controllably turned off while the switches SW3X/SW3Y and SW5X/SW5Y are controllably turned on. In this state, the lower cutoff frequency is set up since the DC servo circuit (DCS) 75 is component-wise operative with the resistor R2X/R2Y and the capacitor C2X/C2Y. The capacitor C2X/C2Y is switched off from the voltage level applied from the inverted output terminal (−)/non-inverted output terminal (+) of the operational amplifier OP2 and the bias voltage Vb. Thus, the lower cutoff frequency is set up, thereby removing flicker noise and DC offset while preventing degradation of a desired signal in the vicinity of DC. Hence, as is the case with the highpass filter (HPF) 7 shown in FIG. 4 according to the preferred embodiment 1 of the present invention, by using the circuit configuration including the programmable gain amplifier (PGA) 61 and the DC servo circuit (DCS) 75 shown in FIG. 12 according to the preferred embodiment 3 of the present invention, it is possible to realize high-speed gain changeover and DC offset removal even in a wireless communication system having a requirement for a relatively short gain setting period such as a wireless LAN system. The receiver 200 capable of reducing DC offset due to a cutoff frequency changeover can thus be provided as a desirable receiving circuit for wireless communication.

Further, in the circuit configuration shown in FIG. 12 according to the preferred embodiment 3 of the present invention, since DC offset removal can be performed with respect to input to the programmable gain amplifier (PGA) 61, there is provided an advantageous feature that the possibility of saturation with DC offset in the programmable gain amplifier (PGA) 61 is extremely low when the amount of DC suppression in the DC servo circuit (DCS) 75 is adequate. It is therefore not necessary to employ any separate means for DC offset removal in the programmable gain amplifier (PGA) 61. Thus, DC offset suppression with high reliability against variations in temperature and other operating environmental conditions can be achieved in a small-area arrangement. Further, in the configuration of the preferred embodiment 3 of the present invention described with reference to FIGS. 11 and 12, since a highpass filter (HPF) is not directly disposed on a signal transmission path, it is possible to alleviate a decrease in signal passband gain as compared with the configuration shown in FIG. 7. In the configuration shown in FIG. 7, the input capacitors C1X, C1Y, C2X, and C2Y are set to have an equal capacitance value for keeping a signal passband gain unchanged before and after a cutoff frequency changeover operation. In the configuration according to the preferred embodiment 3 of the present invention, a filter circuit capable of keeping a signal passband gain unchanged before and after a cutoff frequency changeover can be provided even in a case where the resistor R1X/R1Y and the resistor R2X/R2Y are set to have an equal resistance value and the input capacitor C1X/C1Y and the input capacitor C2X/C2Y are set to have different capacitance values. Further, since a load resistance with respect to the operational amplifier OP1 is attributable to the resistor R1X/R1Y or the resistor R2X/R2Y, the use of an arrangement wherein the resistor R1X/R1Y and the resistor R2X/R2 are set to have an equal resistance value is advantageous in that the characteristics of the operational amplifier OP1 remain unchanged before and after a cutoff frequency changeover.

<Even Still Another Receiver Configuration>

Further, in the receiver 200 shown in FIG. 11 according to the preferred embodiment 3 of the present invention, there may be provided such an arrangement that the anterior-stage highpass filter (HPF) 74 coupled to the output of the mixer (MIX) 3 is replaced by circuits equivalent to the programmable gain amplifier (PGA) 61 and the DC servo circuit (DCS) 75 that are provided in lieu of the programmable gain amplifier (PGA) 6 and the posterior-stage highpass filter (HPF) 7 shown in FIG. 9.

Figure 18:
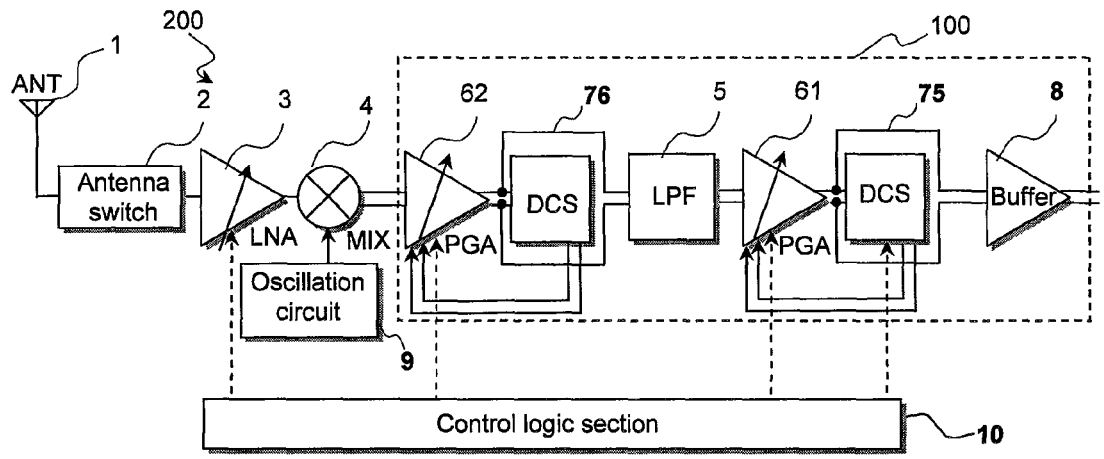
FIG. 18 is a schematic block diagram showing a configuration of even still another receiver 200 according to the preferred embodiment 3 of the present invention.

Referring to FIG. 18, there is shown a configuration of even still another receiver 200 according to the preferred embodiment 3 of the present invention.

The receiver 200 shown in FIG. 18 according to the preferred embodiment 3 of the present invention is different from the receiver 200 shown in FIG. 11 according to the preferred embodiment 3 of the present invention in that a programmable gain amplifier (PGA) 62 and a DC servo circuit (DCS) 76 are provided in lieu of the anterior-stage highpass filter (HPF) 74 included in the receiver 200 shown in FIG. 11.

The DC servo circuit (DCS) 76 shown in FIG. 18 comprises an integrator similarly to the DC servo circuit (DCS) 75 shown in FIGS. 11 and 12. The programmable gain amplifier (PGA) 62 shown in FIG. 18 comprises an adder similarly to the programmable gain amplifier (PGA) 61 shown in FIGS. 11 and 12.

<Another DC Servo Circuit>

Figure 13:
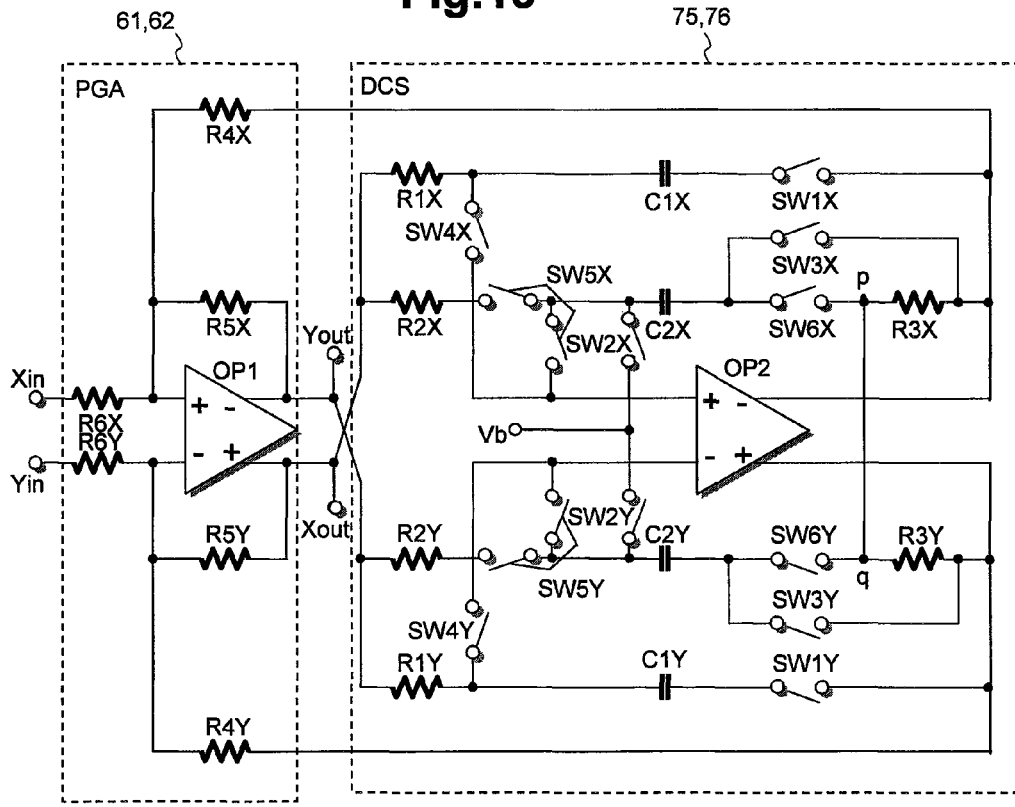
FIG. 13 is a circuit diagram showing another configuration of a programmable gain amplifier (PGA) 61, 62 and a DC servo circuit (DCS) 75, 76 included in the receiver 200 illustrated in FIG. 11 or 18 according to the preferred embodiment 3 of the present invention.

Referring to FIG. 13, there is shown a circuit diagram of another configuration of a programmable gain amplifier (PGA) 61, 62 and a DC servo circuit (DCS) 75, 76 included in the receiver 200 illustrated in FIG. 11 or 18 according to the preferred embodiment 3 of the present invention.

The programmable gain amplifier (PGA) 61, 62 in the circuit configuration shown in FIG. 13 comprises an adder including first input resistors R6X and R6Y, second input resistors R4X R4Y, negative feedback resistors R5X and R5Y, and an operational amplifier OP1 similarly to the programmable gain amplifier (PGA) 61 shown in FIG. 12.

The DC servo circuit (DCS) 75, 76 in the circuit configuration shown in FIG. 13 is different from the DC servo circuit (DCS) 75 shown in FIG. 12 in that there are provided additional switches SW6X and SW6Y and an additional short-circuit wiring line between nodes p and q similarly to the highpass filter (HPF) 7 according to the preferred embodiment 1 shown in FIG. 7.

In the DC servo circuit (DCS) 75 shown in FIG. 12, the capacitor C2X/C2Y is charged with the voltage level applied from the inverted-output terminal (−)/non-inverted output terminal (+) of the operational amplifier OP2 via the resistor R3X/R3Y and the bias voltage Vb, thereby alleviating the dependency on an input amplitude level. However, if an excessive input amplitude is applied in the DC servo circuit (DCS) 75 shown in FIG. 12, there is a possibility that a significant magnitude of DC offset may occur depending on the input amplitude at the time of a cutoff frequency changeover.

Contrastingly, in the DC servo circuit (DCS) 75 shown in FIG. 13, the nodes p and q are short-circuited by the short-circuit wiring line disposed therebetween, and a potential at the node p/q is determined based on the midpoint of voltage dividing through the resistor R3X/R3Y with respect to a voltage level at the inverted-output terminal (−)/non-inverted output terminal (+) of the operational amplifier OP2.

When the higher cutoff frequency is set up, one end of the capacitor C2X/C2Y is fed with the potential at the node p/q via the switch SW6X/SW6Y in a turned-on state, and the other end of the capacitor C2X/C2Y is fed with the bias voltage Vb via the switch SW2X/SW2Y in a turned-on state. Thus, the capacitor C2X/C2Y is charged. Even if there is a signal amplitude between the inverted-output terminal (−) and the non-inverted output terminal (+) of the operational amplifier OP2, the signal amplitude is canceled by short-circuiting through the short-circuit wiring line between the nodes p and q, resulting in just a DC component remaining. Thus, since the dependency on an input amplitude level is alleviated, it is possible to charge the capacitor C2X/C2Y in a desirable manner. When the lower cutoff frequency is set up, the switch SW6X/SW6Y is controllably turned off, causing the one end of the capacitor C2X/C2Y to be switched off from the potential applied from the node p/q.

The operations to be performed in the circuit configuration shown in FIG. 13 are similar to those in the highpass filter (HPF) 7 shown in FIG. 7 according to the preferred embodiment 1 of the present invention and in the programmable gain amplifier (PGA) 61 and the DC servo circuit (DCS) 75 shown in FIG. 12 according to the preferred embodiment 3 of the present invention, and therefore, no repetitive description thereof is given herein.

Hence, as is the case with the highpass filter (HPF) 7 shown in FIG. 7 according to the preferred embodiment 1 of the present invention, by using the arrangement of the programmable gain amplifier (PGA) 61, 62 and the DC servo circuit (DCS) 75, 76 shown in FIG. 13 according to the preferred embodiment 3 of the present invention, it is possible to realize high-speed gain changeover and DC offset reduction even in a wireless communication system having a requirement for a relatively short gain setting period such as a wireless LAN system. Further, in a situation where an RF signal input having a relatively large input amplitude is supplied, DC offset reduction can be accomplished reliably, allowing provision of the receiver 200 capable of serving as a desirable receiving circuit for wireless communication.

<Still Another DC Servo Circuit>

Figure 14:
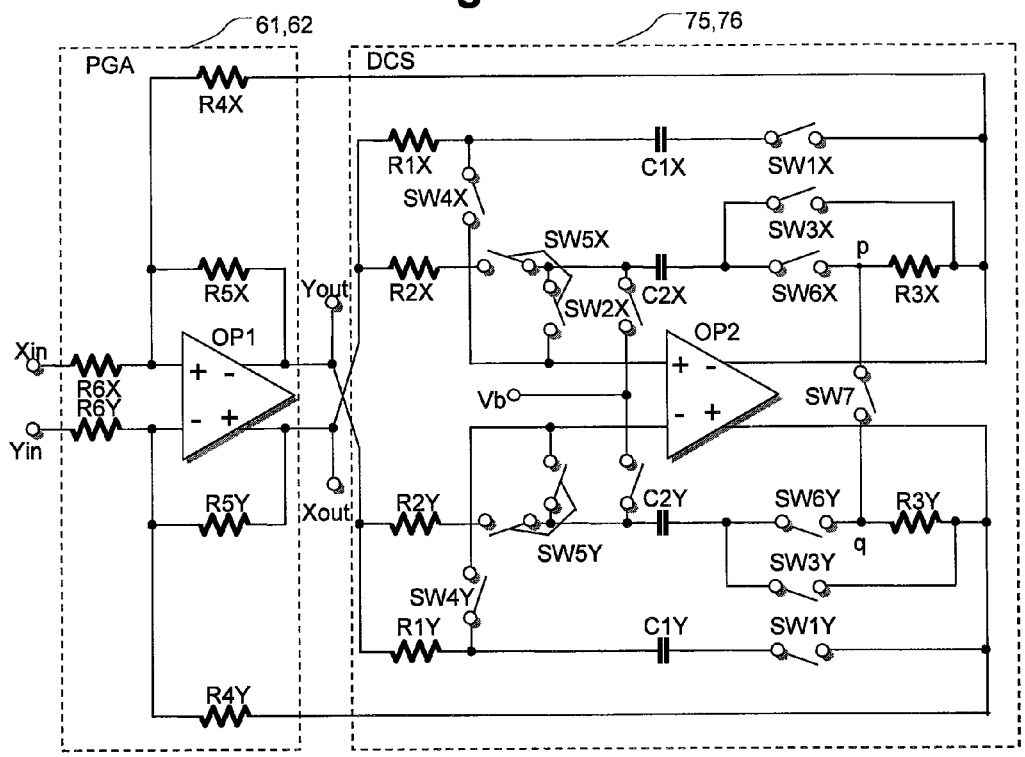
FIG. 14 is a circuit diagram showing sill another configuration of the programmable gain amplifier (PGA) 61, 62 and the DC servo circuit (DCS) 75, 76 included in the receiver 200 illustrated in FIG. 11 or 18 according to the preferred embodiment 3 of the present invention.

Referring to FIG. 14, there is shown a circuit diagram of still another configuration of the programmable gain amplifier (PGA) 61, 62 and the DC servo circuit (DCS) 75, 76 included in the receiver 200 illustrated in FIG. 11 or 18 according to the preferred embodiment 3 of the present invention.

The programmable gain amplifier (PGA) 61, 62 in the circuit configuration shown in FIG. 14 comprises an adder including first input resistors R6X and R6Y, second input resistor R4X and R4Y, negative feedback resistors R5X and R5Y, and an operational amplifier OP1 similarly to the programmable gain amplifier (PGA) 61, 62 shown in FIG. 13.

The DC servo circuit (DCS) 75, 76 in the circuit configuration shown in FIG. 14 is different from the DC servo circuit (DCS) 75, 76 shown in FIG. 13 in that there is provided an additional switch SW7 on a line between the nodes p and q in a fashion similar to that in the highpass filter (HPF) 7 shown in FIG. 8 according to the preferred embodiment 1 of the present invention.

The additional switch SW7 in the DC servo circuit (DCS) 75, 76 shown in FIG. 14 is turned on/off under direction of the control logic section 10 included in the receiver 200 illustrated in FIG. 11 or 18 according to the preferred embodiment 3 of the present invention. When the additional switch SW7 shown in FIG. 14 is controllably turned off, there is formed a circuit configuration which is functionally equivalent to that of FIG. 12. Alternatively, when the additional switch SW7 shown in FIG. 14 is controllably turned on, there is formed a circuit configuration which is functionally equivalent to that of FIG. 13. That is, in the arrangement shown in FIG. 14, by turning off/on the additional switch SW7, a selection can be made between the circuit configuration equivalent to that of FIG. 12 and the circuit configuration equivalent to that of FIG. 13. In the circuit configuration shown in FIG. 12, when a DC offset value in a circuit stage anterior thereto is relatively large and an input amplitude is relatively small, it is possible to reduce DC offset due to a cutoff frequency changeover at high efficiency as compared with the circuit configuration shown in FIG. 13. Contrastingly, in the circuit configuration shown in FIG. 13, DC offset at a circuit stage anterior thereto is likely to appear in output though DC offset attributable to an input amplitude at the time of a cutoff frequency changeover can be reduced. Hence, in the DC servo circuit (DCS) 75, 76 shown in FIG. 14, when it is predicted that a DC offset value at a circuit stage anterior thereto is relatively large and an input amplitude is relatively small, the additional switch SW7 is controllably turned off to form a circuit configuration equivalent to that of FIG. 12. Alternatively, in the DC servo circuit (DCS) 75, 76 shown in FIG. 14, when it is predicted that a DC offset value at the anterior circuit stage is relatively small and an input amplitude is relatively large, the additional switch SW7 is controllably turned on to form a circuit configuration equivalent to that of FIG. 13.

As mentioned above, in the DC servo circuit (DCS) 75, 76 shown in FIG. 14, the additional switch SW7 is controllably turned off/on in accordance with a DC offset condition at the anterior circuit stage and an input signal amplitude condition. Thus, a selection is made between the circuit configuration equivalent to the programmable gain amplifier (PGA) 61 and the DC servo circuit (DCS) 75 shown in FIG. 12 that is capable of performing highly efficient removal of DC offset components due to a cutoff frequency changeover (according to the preferred embodiment 3 of the present invention), and the circuit configuration equivalent to the programmable amplifier (PGA) 61, 62 and the DC servo circuit (DCS) 75, 76 shown in FIG. 13 that is capable of reducing DC offset attributable to an input amplitude at the time of a cutoff frequency changeover. As regards the timing of selection between these circuit configurations, there may be provided such an arrangement that an input amplitude level is determined in accordance with a signal indicating the end of gain setting that is received from another IC, for example. More specifically, a threshold value or the like is provided for gain setting in the programmable gain amplifier (PGA) or the low noise amplifier (LNA) that is operative with a control signal or the like from the control logic section 10, and then, in accordance with the threshold value or the like, the additional switch SW7 in the DC servo circuit (DCS) 75, 76 shown in FIG. 14 is controllably turned off/on to make a proper selection between the circuit configuration equivalent to that shown in FIG. 12 and the circuit configuration equivalent to that shown in FIG. 13.

Hence, as is the case with the highpass filter (HPF) 7 shown in FIG. 8 according to the preferred embodiment 1 of the present invention, by using the arrangement of the programmable gain amplifier (PGA) 61, 62 and the DC servo circuit (DCS) 75, 76 shown in FIG. 14 according to the preferred embodiment 3 of the present invention, it is possible to realize high-speed gain changeover and DC offset removal even in a wireless communication system having a requirement for a relatively short gain setting period such as a wireless LAN system. Further, since the arrangement shown in FIG. 14 allows a configuration selection to be made in accordance with an input amplitude level and a DC offset value, it is possible to ensure reliable removal of DC offset for provision of the receiver 200 capable of serving as a desirable receiving circuit for wireless communication. In addition, on account of the advantage that most of the configurations shown in FIGS. 12 and 13 can be arranged for use in common, the arrangement shown in FIG. 14 enables provision of a small area feature for the receiver 200.

While a configurational selection is made in the arrangement of the programmable gain amplifier (PGA) 61, 62 and the DC servo circuit (DCS) 75, 76 shown in FIG. 14 according to the preferred embodiment 3 of the present invention through detection of an input amplitude level and a DC offset value as described above, there may also be provided a modified arrangement wherein a configurational selection in the arrangement shown in FIG. 14 is performed at a predetermined time by using a timer.

<Even Still Another DC Servo Circuit>

Figure 15:
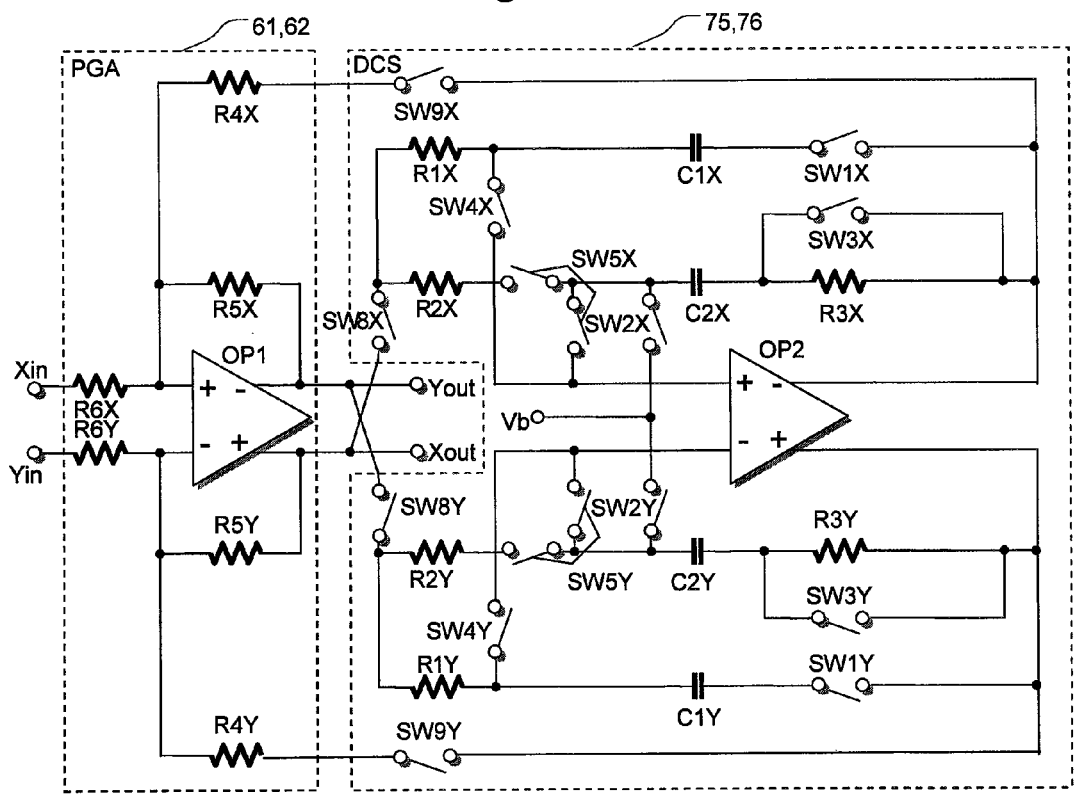
FIG. 15 is a circuit diagram showing even still another configuration of the programmable gain amplifier (PGA) 61, 62 and the DC servo circuit (DCS) 75, 76 included in the receiver 200 illustrated in FIG. 11 or 18 according to the preferred embodiment 3 of the present invention.

Referring to FIG. 15, there is shown a circuit diagram of even still another configuration of the programmable gain amplifier (PGA) 61, 62 and the DC servo circuit (DCS) 75, 76 included in the receiver 200 illustrated in FIG. 11 or 18 according to the preferred embodiment 3 of the present invention.

The programmable gain amplifier (PGA) 61, 62 and the DC servo circuit (DCS) 75, 76 in the circuit configuration shown in FIG. 15 according to the preferred embodiment 3 of the present invention is different from the case of the programmable amplifier (PGA) 61 and the DC servo circuit (DCS) 75 shown in FIG. 12 according to the preferred embodiment 3 of the present invention in that there are provided additional switches SW8X and SW8Y and additional switches SW9X and SW9Y at input and output parts of the DC servo circuit (DCS) 75, 76, respectively.

The additional switch SW8X/SW8Y, the additional switch SW9X/SW9Y, and the operational amplifier OP2 are operated under direction of the control logic section 10 included in the receiver 200 illustrated in FIG. 11 or 18 according to the preferred embodiment 3 of the present invention. When the additional switch SW8X/SW8Y, the additional switch SW9X/SW9Y, and the operational amplifier OP2 are controllably turned off simultaneously, a high impedance is set at the input/output of the DC servo circuit (DCS) 75, resulting in no highpass filter characteristic at the differential output terminal Xout/Yout of the programmable gain amplifier (PGA) 61, 62. When the additional switch SW8X/SW8Y, the additional switch SW9X/SW9Y, and the operational amplifier OP2 are controllably turned on simultaneously, operations similar to those in the programmable gain amplifier (PGA) 61 and the DC servo circuit (DCS) 75 according to the preferred embodiment 3 of the present invention are enabled to provide a highpass filter characteristic at the differential output terminal Xout/Yout of the programmable gain amplifier (PGA) 61, 62.

Thus, in the arrangement of the programmable gain amplifier (PGA) 61, 62 and the DC servo circuit (DCS) 75, 76 shown in FIG. 15 according to the preferred embodiment 3 of the present invention, it is possible to nullify the highpass filter function in situations where the nonuse of a highpass filter characteristic is preferable. For instance, where received signals are present in the vicinity of DC as in the case of WCDMA communication, if signal components in the vicinity of DC are suppressed for removal of flicker noise or the like by the DC servo circuit (DCS) 75, a desired signal may also be suppressed along with flicker noise or the like, causing degradation in quality of signal reception. In such a situation, the additional switch SW8X/SW8Y, the additional switch SW9X/SW9Y, and the operational amplifier OP2 are controllably turned off to lessen the adverse effect of signal suppression in the vicinity of DC. Although there remains flicker noise or the like to some extent, such noise can be reduced by using a highpass filter having a large time constant in a digital signal processing section disposed at a stage posterior to the buffer 8. In wireless LAN communication where a short period of time is required for high-speed gain settlement, a highpass filter having a large time constant may not be applicable on a constant basis. In continuous signal reception applications such as in WCDMA communication, a highpass filter having a large time constant is applicable on a constant basis for reducing noise in the vicinity of DC while minimizing suppression of a desired signal.

Thus, it is possible to provide the receiver 200 capable of performing a configurational selection between a communication application such as wireless LAN communication where high-speed gain settlement is required, and a communication application such as WCDMA communication where the processing of a desired signal in the vicinity of DC is required though low-speed gain settlement is allowable. In addition, on account of the advantage that a configurational selection function can be provided merely by adding switches, the arrangement shown in FIG. 15 enables provision of a small area feature for the receiver 200.

It is to be noted that switches used in a variety of embodiments of the present invention may be of any type that can be turned on/off controllably in response to control signals. It is allowed to use such switches as MOS switches and CMOS switches that can be turned on/off controllably in response to control signals from the control logic section 10, for example.

While the present invention made by the present inventors has been described in detail with respect to specific embodiments thereof, it is to be understood that the present invention is not limited by any of the details of description and that various changes and modifications may be made in the present invention without departing from the spirit and scope thereof.

Although the foregoing descriptions of the present invention made by the present inventors have been given as related to the cases of background-field application to the receiver 200 for wireless LAN communication based on a direct conversion scheme, it is to be understood that the present invention is not limited thereto but is applicable to a variety of receiving circuits.

For example, it is to be recognized that the present invention is applicable to various receiving circuits to be designed in conformance with the IEEE 802.11b/g/n for wireless LAN communication, DSRC (Dedicated Short Range Communication)/IEEE 802.11p for vehicle-to-vehicle communication, and other standards including those for mobile phone communication and television broadcast reception.

What is claimed is:

1. A filter circuit capable of allowing settings of a first cutoff frequency and a second cutoff frequency, comprising:
   a first filter including a first capacitor and a first resistor;
   a second filter including a second capacitor and a second resistor;
   a first filter switch circuit for coupling the first filter on a signal path;
   a second filter switch circuit for coupling the second filter on the signal path; and
   a charging circuit coupled to the second filter,
   wherein the charging circuit comprises at least a charging resistor and a charging switch that are coupled in series with one end of the second capacitor of the second filter and in series with the other end of the second capacitor, respectively,
   wherein, for setting up the first cutoff frequency, the first filter switch circuit is controllably turned on while the second filter switch circuit is controllably turned off for a first time period so that the first filter participates in operation of the filter circuit,
   wherein, for setting up the second cutoff frequency, the first filter switch circuit is controllably turned off while the second filter switch circuit is controllably turned on for a second time period subsequent to the first time period so that the second filter participates in operation of the filter circuit, and
   wherein the charging switch of the charging circuit is controllably turned on for the first time period so that the second capacitor of the second filter can be charged via the charging resistor of the charging circuit.

2. The filter circuit according to claim 1,
   wherein the first filter is arranged to provide a differential configuration comprising a first filter pair, the first capacitor is arranged to provide a differential configuration comprising a first capacitor pair, and the first resistor is arranged to provide a differential configuration comprising a first resistor pair,
   wherein the second filter is arranged to provide a differential configuration comprising a second filter pair, the second capacitor is arranged to provide a differential configuration comprising a second capacitor pair, and the second resistor is arranged to provide a differential configuration comprising a second resistor pair,
   wherein the first filter switch circuit is arranged to provide a differential configuration comprising a first filter switch circuit pair, and the second filter switch circuit is arranged to provide a differential configuration comprising a second filter switch circuit pair, and wherein the charging circuit is arranged to provide a differential configuration comprising a charging circuit pair, the charging resistor is arranged to provide a differential configuration comprising a charging resistor pair, and the charging switch is arranged to provide a differential configuration comprising a charging switch pair.

3. The filter circuit according to claim 2,
wherein each resistor of the charging resistor pair arranged in the differential configuration is coupled in parallel with each switch of the second filter switch circuit pair arranged in the differential configuration.

4. The filter circuit according to claim 3,
wherein each resistor of the second resistor pair arranged in the differential configuration is coupled in parallel with each switch of the charging switch pair arranged in the differential configuration, and a predetermined bias voltage is applicable to a coupling point common to each resistor of the second resistor pair and each switch of the charging switch pair.

5. The filter circuit according to claim 4,
wherein the charging circuit further comprises a control switch pair arranged in a differential configuration, and
wherein one end of each switch of the control switch pair arranged in the differential configuration is coupled to one end of each capacitor of the second capacitor pair arranged in the differential configuration, and the other end of each switch of the control switch pair is coupled to one end of each resistor of the charging resistor pair arranged in the differential configuration.

6. The filter circuit according to claim 5,
wherein a short-circuit wiring line is provided between mutually corresponding end nodes of the respective resistors of the charging resistor pair.

7. The filter circuit according to claim 5,
wherein a coupling switch is disposed on a line between the mutually corresponding end nodes of the respective resistors of the charging resistor pair, and the coupling switch is controllably turned on for the first time period.

8. The filter circuit according to claim 2,
wherein the first filter pair arranged in the differential configuration and the second filter pair arranged in the differential configuration are incorporated in a semiconductor integrated circuit, and the first cutoff frequency is set up at a level higher than that of the second cutoff frequency.

9. A filter circuit capable of allowing settings of a first cutoff frequency and a second cutoff frequency, comprising:
a first filter comprising a first capacitor and a first resistor;
a second filter comprising a second capacitor and a second resistor;
an operational amplifier comprising an input terminal and an output terminal;
a first filter switch circuit for coupling the first filter on a signal path and to the input terminal and the output terminal of the operational amplifier;
a second filter switch circuit for coupling the second filter on the signal path and to the input terminal and the output terminal of the operational amplifier; and
a charging circuit coupled to the second filter,
wherein the charging circuit comprises at least a charging resistor and a charging switch that are coupled in series with one end of the second capacitor of the second filter and in series with the other end of the second capacitor, respectively,
wherein, for setting up a the first cutoff frequency, the first filter switch circuit is controllably turned on while the second filter switch circuit is controllably turned off for a first time period so that the first filter participates in operation of the filter circuit,
wherein, for setting up the second cutoff frequency, the first filter switch circuit is controllably turned off while the second filter switch circuit is controllably turned on for a second time period subsequent to the first time period so that the second filter participates in operation of the filter circuit, and
wherein the charging switch of the charging circuit is controllably turned on for the first time period so that the second capacitor of the second filter can be charged via the charging resistor of the charging circuit.

10. The filter circuit according to claim 9,
wherein the first filter is arranged to provide a differential configuration comprising a first filter pair, the first capacitor is arranged to provide a differential configuration comprising a first capacitor pair, and the first resistor is arranged to provide a differential configuration comprising a first resistor pair,
wherein the second filter is arranged to provide a differential configuration comprising a second filter pair, the second capacitor is arranged to provide a differential configuration comprising a second capacitor pair, and the second resistor is arranged to provide a differential configuration comprising a second resistor pair,
wherein the first filter switch circuit is arranged to provide a differential configuration comprising a first filter switch circuit pair, and the second filter switch circuit is arranged to provide a differential configuration comprising a second filter switch circuit pair, and
wherein the charging circuit is arranged to provide a differential configuration comprising a charging circuit pair, the charging resistor is arranged to provide a differential configuration comprising a charging resistor pair, and the charging switch is arranged to provide a differential configuration comprising a charging switch pair.

11. The filter circuit according to claim 10,
wherein each resistor of the charging resistor pair arranged in the differential configuration is coupled in parallel with each switch of the second filter switch circuit pair arranged in the differential configuration.

12. The filter circuit according to claim 11,
wherein each resistor of the second resistor pair arranged in the differential configuration is coupled to each switch of the charging switch pair arranged in the differential configuration, and a predetermined bias voltage is applicable to a coupling point common to each switch of the charging switch pair.

13. The filter circuit according to claim 12,
wherein the charging circuit further comprises a control switch pair arranged in a differential configuration, and
wherein one end of each switch of the control switch pair arranged in the differential configuration is coupled to one end of each capacitor of the second capacitor pair arranged in the differential configuration, and the other end of each switch of the control switch pair is coupled to one end of each resistor of the charging resistor pair arranged in the differential configuration.

14. The filter circuit according to claim 13,
wherein a short-circuit wiring line is provided between mutually corresponding end nodes of the respective resistors of the charging resistor pair.

15. The filter circuit according to claim 14,
wherein a coupling switch is disposed on a line between the mutually corresponding end nodes of the respective resistors of the charging resistor pair, and the coupling switch is controllably turned on for the first time period.

16. The filter circuit according to claim 10,
wherein the first filter pair arranged in the differential configuration and the second filter pair arranged in the differential configuration are incorporated in a semiconductor integrated circuit, and the first cutoff frequency is set up at a level higher than that of the second cutoff frequency.

17. A receiver comprising:
a first amplifier for amplifying a received signal;
a mixer for performing frequency conversion of an output signal from the first amplifier; and
a baseband signal processing section disposed at a stage posterior to the mixer so as to process an output signal from the mixer,
wherein the baseband signal processing section comprises a second amplifier for amplifying a signal fed from the mixer, and a filter circuit for filtering an output signal from the second amplifier, and
wherein the filter circuit of the baseband signal processing section is implemented in a form of the filter circuit set forth in claim 1.

18. The receiver according to claim 17, further comprising:
a control section arranged for setting up a gain level of the first amplifier and a gain level of the second amplifier in succession;
wherein, under direction of the control section, the first cutoff frequency is set up in the filter circuit for the first time period, and then the second cutoff frequency is set up in the filter circuit for the second time period.

19. The receiver according to claim 18,
wherein the receiver is arranged to be capable of receiving signals in conformance with the IEEE 802.11a, 802.11b, 802.11g, 802.11n, or 802.11p standard for wireless LAN communication, and
wherein, for the first time period and the second time period, the receiver can receive short training sequence signals for the wireless LAN communication.

\* \* \* \* \*